United States Patent [19]

Abe et al.

[11] Patent Number: 5,155,573
[45] Date of Patent: Oct. 13, 1992

[54] FERROELECTRIC CAPACITOR AND A SEMICONDUCTOR DEVICE HAVING THE SAME

[75] Inventors: Kazuhide Abe, Kawasaki; Hiroshi Toyoda, Yokohama; Koji Yamakawa, Kawasaki; Motomasa Imai, Tokyo; Mitsuo Harata, Kawasaki; Koji Sakui, Tokyo, all of Japan

[73] Assignee: Kabushiki Kaisha Toshiba, Kawasaki, Japan

[21] Appl. No.: 633,324

[22] Filed: Dec. 24, 1990

[30] Foreign Application Priority Data

Dec. 25, 1989 [JP] Japan .................. 1-332604
Mar. 30, 1990 [JP] Japan .................. 2-84647
Nov. 27, 1990 [JP] Japan .................. 2-320987

[51] Int. Cl.$^5$ .............. H01L 29/28; H01L 27/02; H01L 29/06; H01L 29/68
[52] U.S. Cl. .................. 357/51; 357/23.6; 357/55; 365/145
[58] Field of Search ......... 357/23.6, 51, 52, 55; 365/145, 149

[56] References Cited

U.S. PATENT DOCUMENTS

| | | | |
|---|---|---|---|
| 3,569,795 | 5/1969 | Gikow. | |
| 4,707,897 | 11/1987 | Rohrer et al. | |
| 4,967,247 | 10/1990 | Kaga et al. | 357/49 |
| 5,021,843 | 6/1991 | Ohmi | 357/23.1 |
| 5,031,144 | 7/1991 | Persky | 357/23.6 |

FOREIGN PATENT DOCUMENTS

0380326 1/1990 European Pat. Off. .
2042611 8/1970 Fed. Rep. of Germany .

OTHER PUBLICATIONS

Hideaki Adachi et al., Ferroelectric (Pb,La) (Zr,Ti)O$_3$ Epitaxial Thin Films on Sapphire Grown by RF-Planar Magnetron Sputtering, *J. Appl. Phys.*, 60(2), Jul. 15, 1986, American Institute of Physics, pp. 736-741.

Tatsuo Fukami et al., Asymmetric Hysteresis Loops of Ferroelectric PZT Film, *Jpn. J. Appl. Phys.*, vol. 24, (1985), No. 5, pp. 632-633.

*Digest of 1989 IEEE International Solid-State Conference*, FAM 16.3, R. Womack et al.; Feb. 17, 1989, pp. 242-243.

*Digest of 1989 IEEE International Solid-State Conference*, FAM 16.3; R. Womack et al.; Feb. 17, 1989; "A 16kb Ferroelectric Nonvolatile Memory with a Bit Parallel Architecture", pp. 242-243.

*Primary Examiner*—J. Carroll
*Attorney, Agent, or Firm*—Oblon, Spivak, McClelland, Maier & Neustadt

[57] ABSTRACT

A ferroelectric capacitor includes a ferroelectric layer consisting of lead zirconate titanate formed on a silicon substrate, a plurality of rectangular trenches formed in the direction of thickness of the ferroelectric layer with a ferroelectric material therebetween, and first and second electrodes consisting of metal tungsten buried in the trenches to oppose each other with the ferroelectric material therebetween.

17 Claims, 37 Drawing Sheets

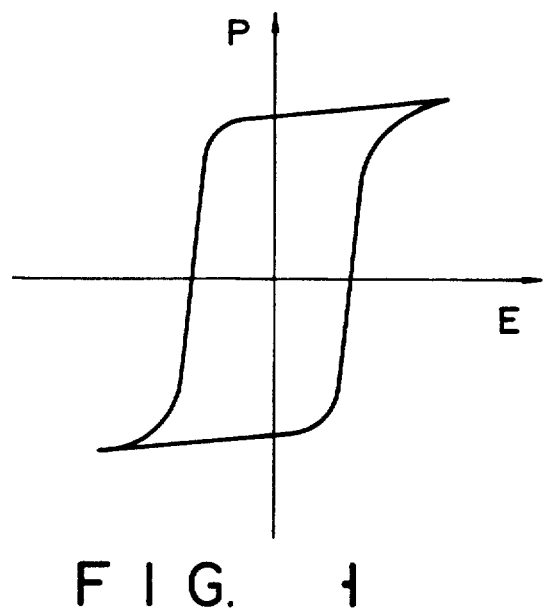
F I G. 1
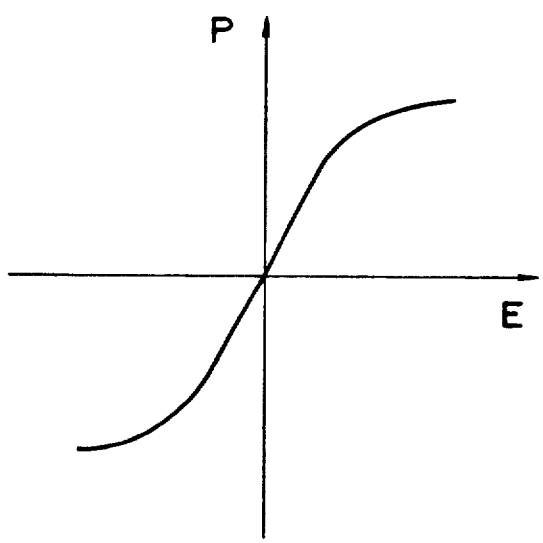
F I G. 2

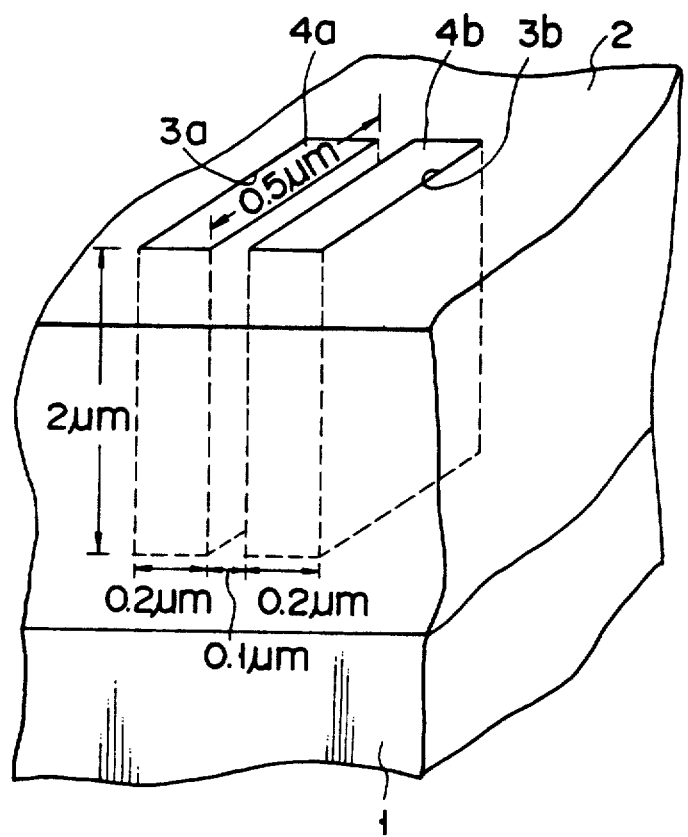
F I G. 5

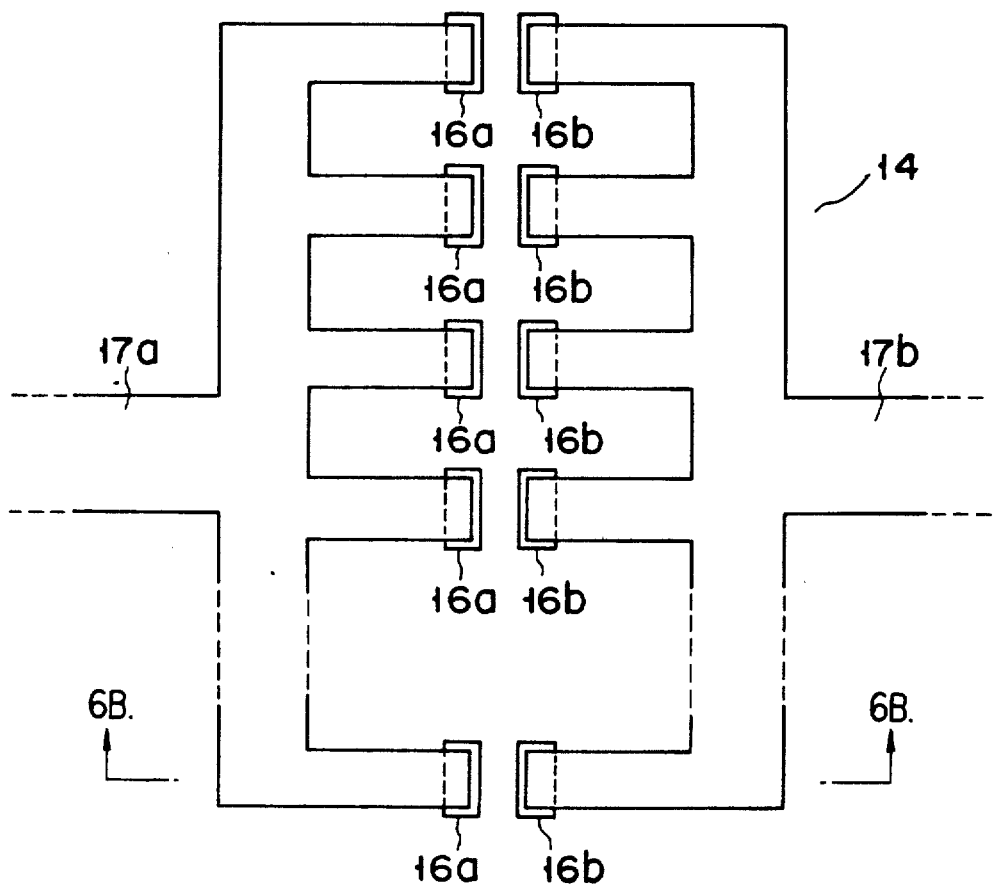
F I G. 6A

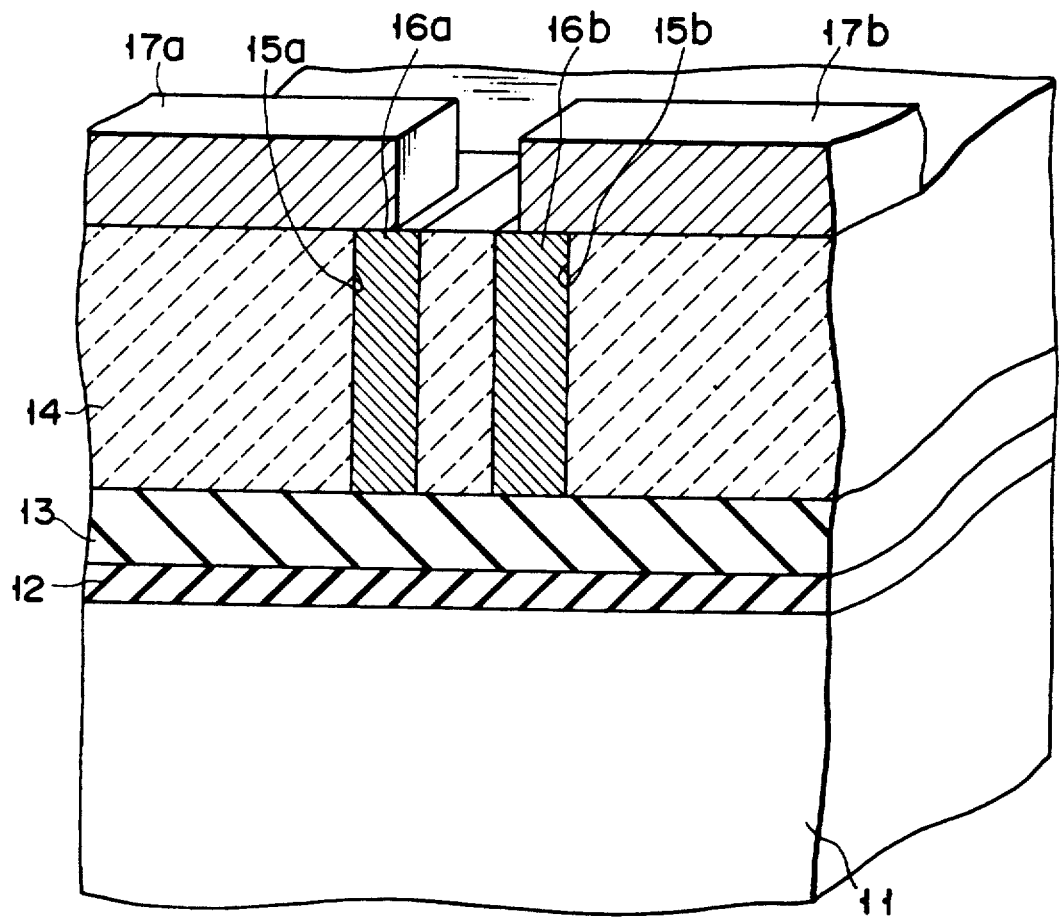
F I G. 6B

VOLTAGE : 2V/div
ELECTRIC CHARGE AMOUNT : 200pc/div

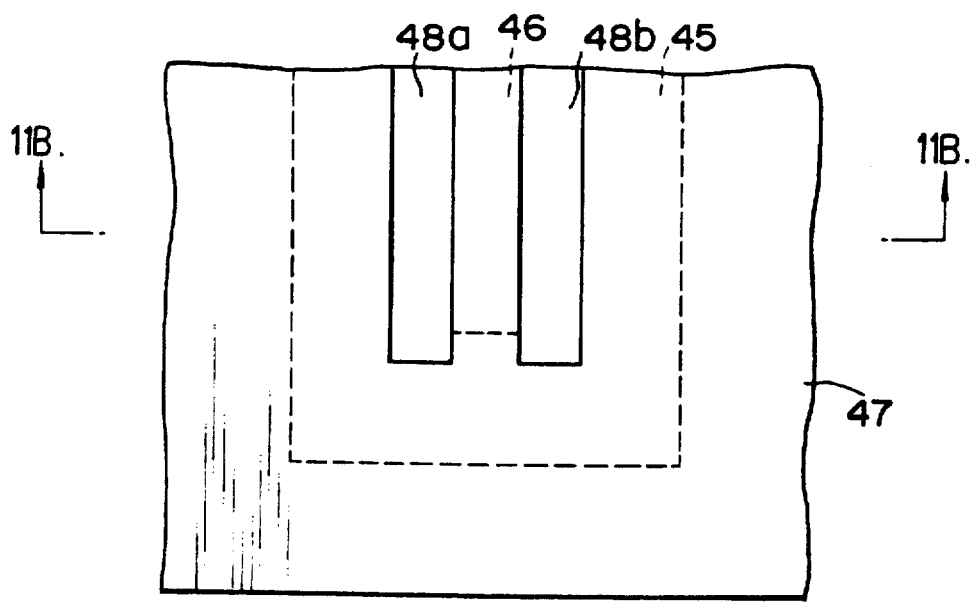
F I G. 11A
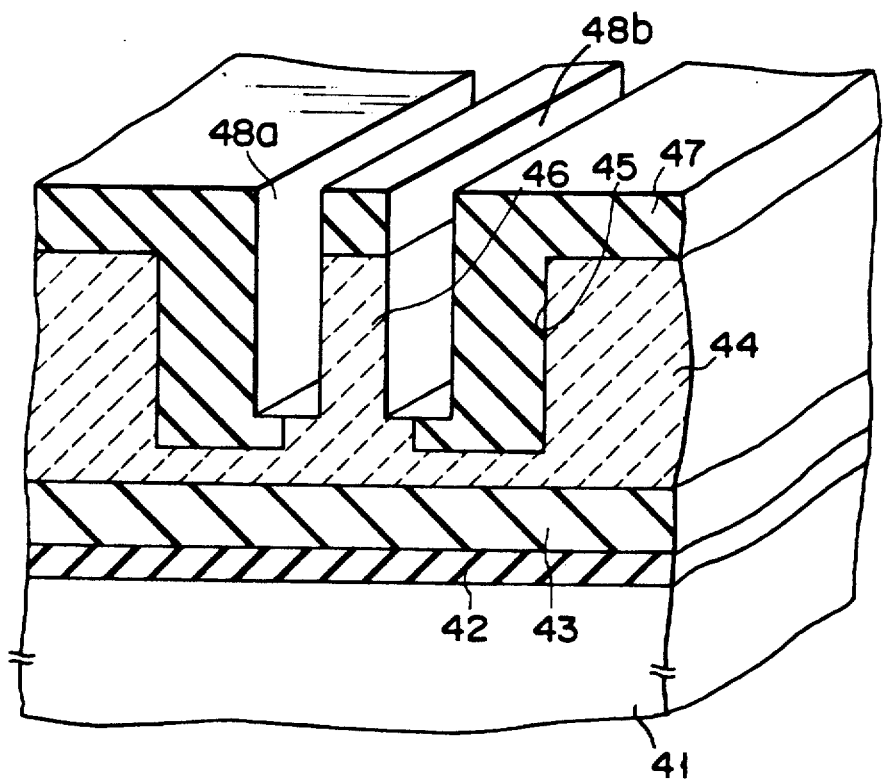
F I G. 11B

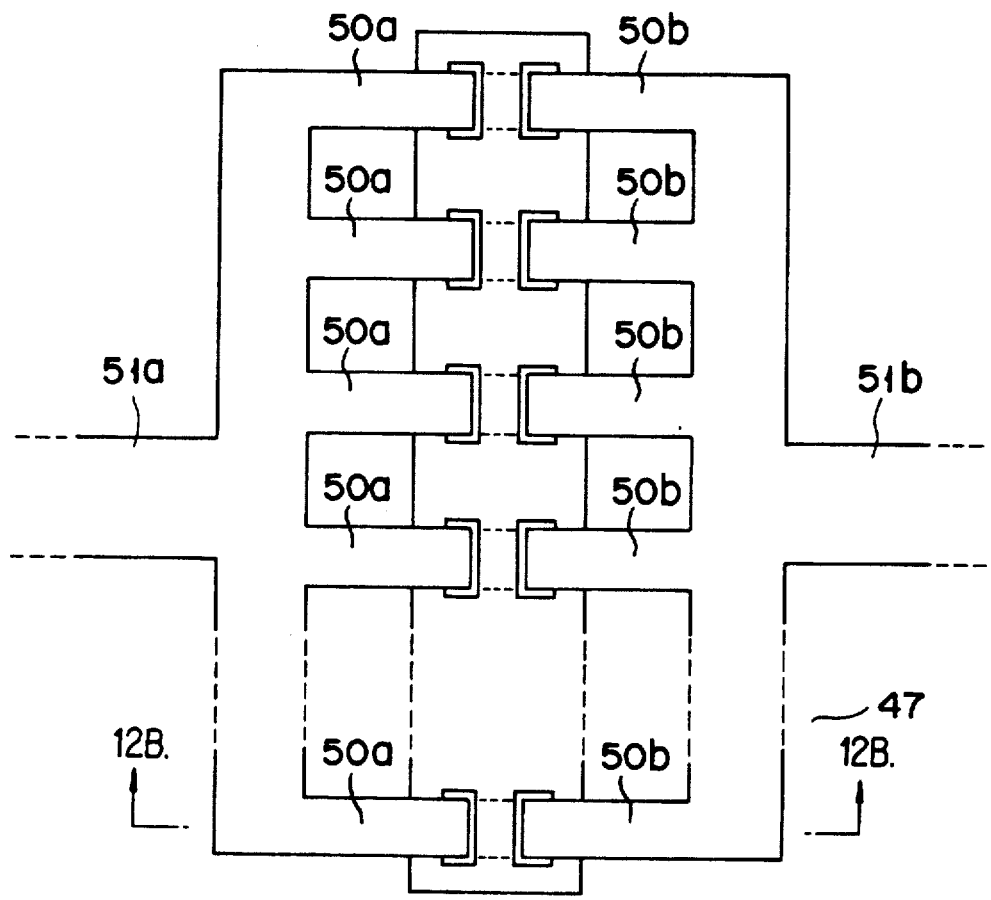
F I G. 12A

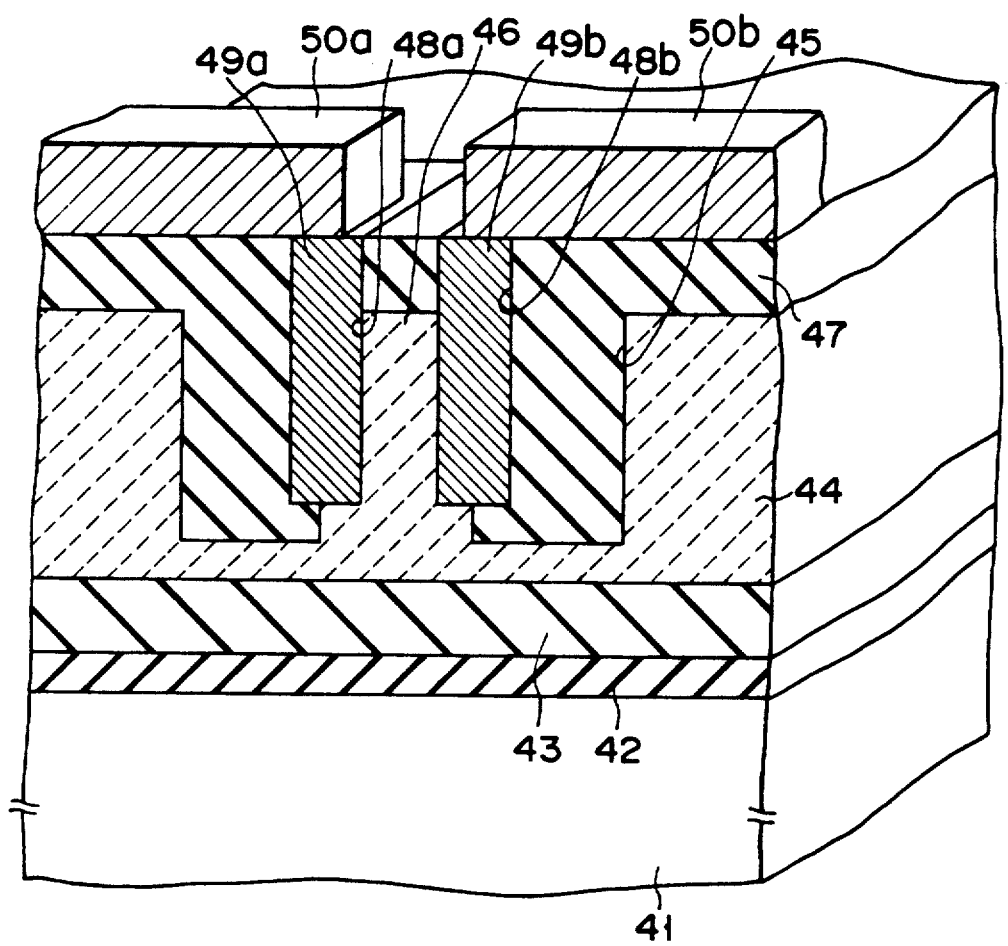
F I G. 12B

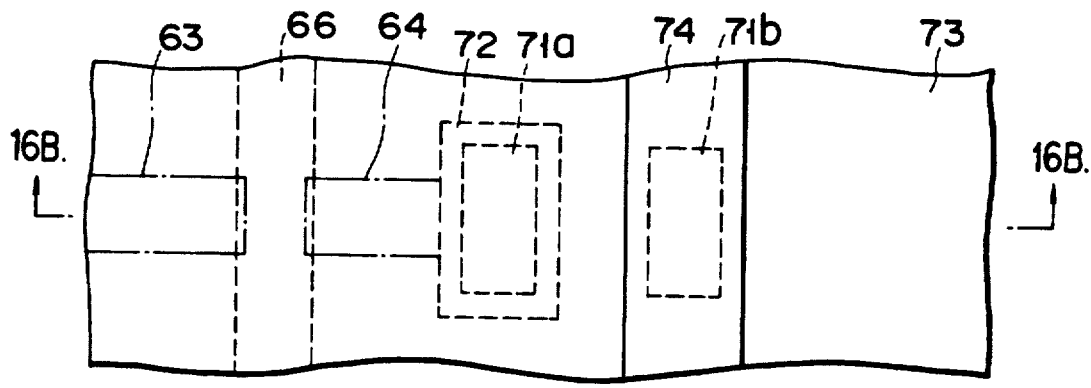
F I G. 16A
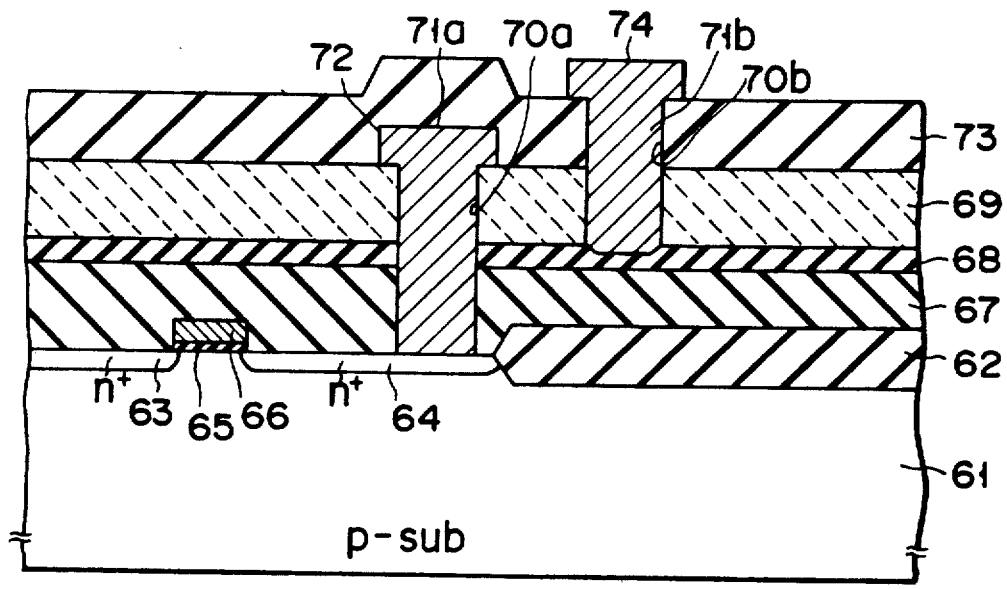
F I G. 16B

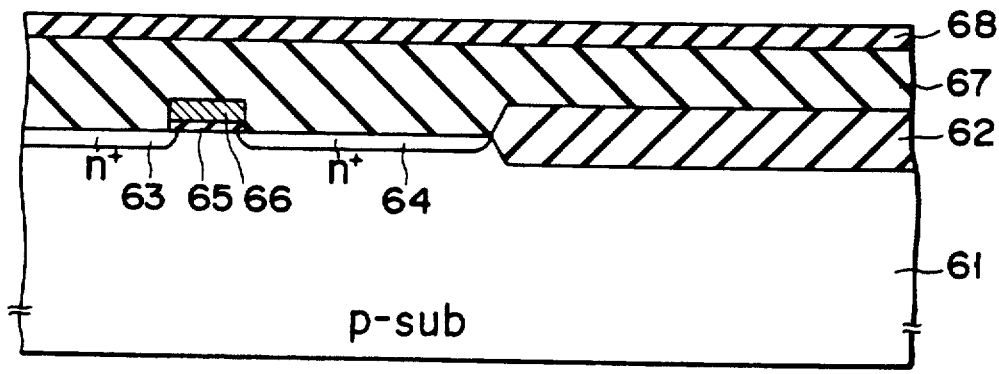
F I G. 18A
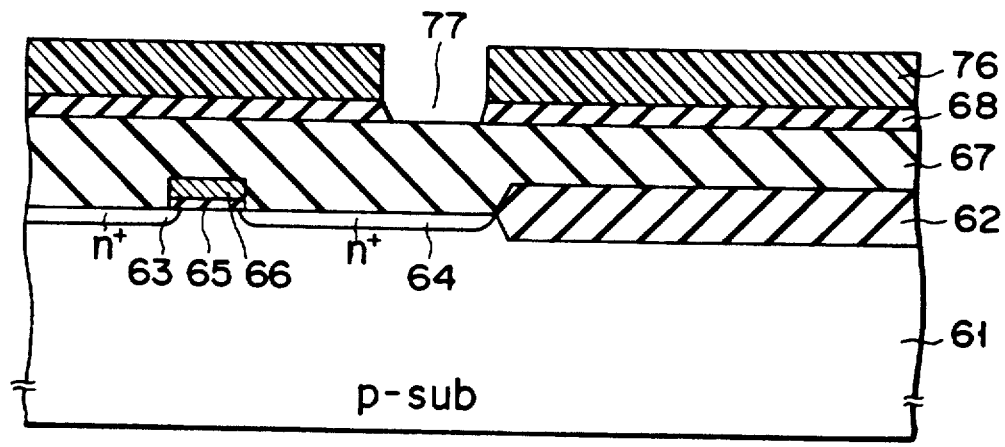
F I G. 18B

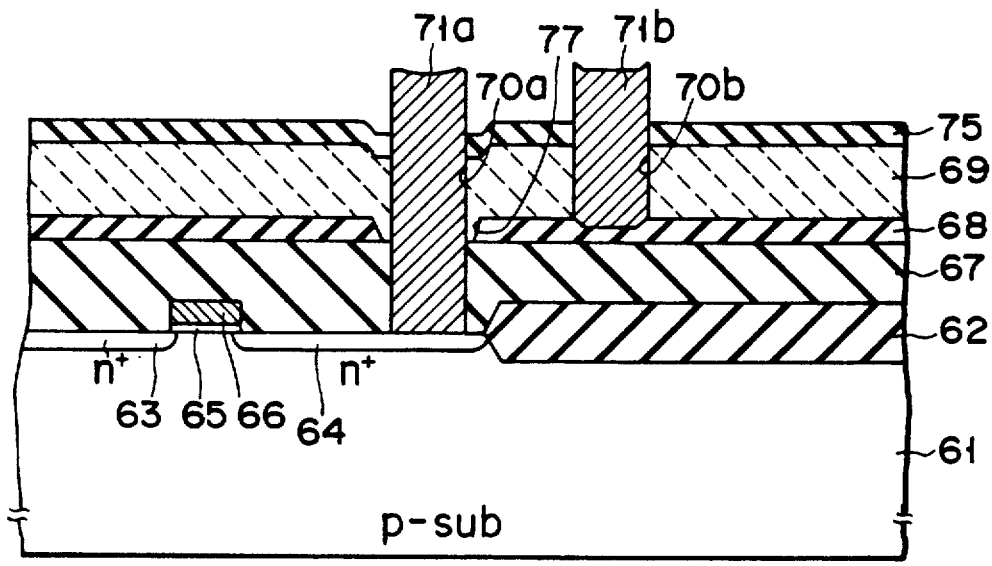
F I G. 18G
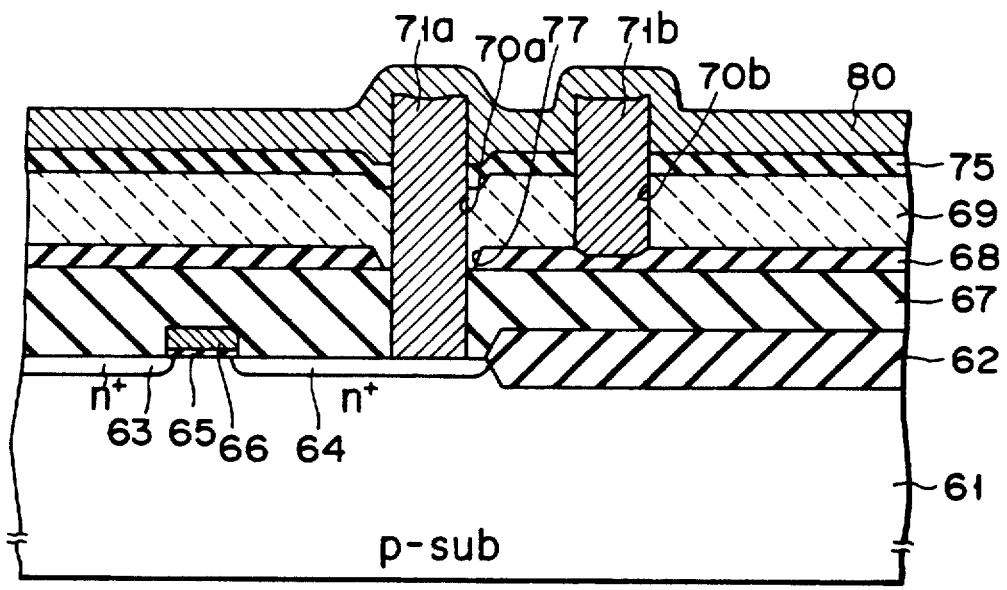
F I G. 18H

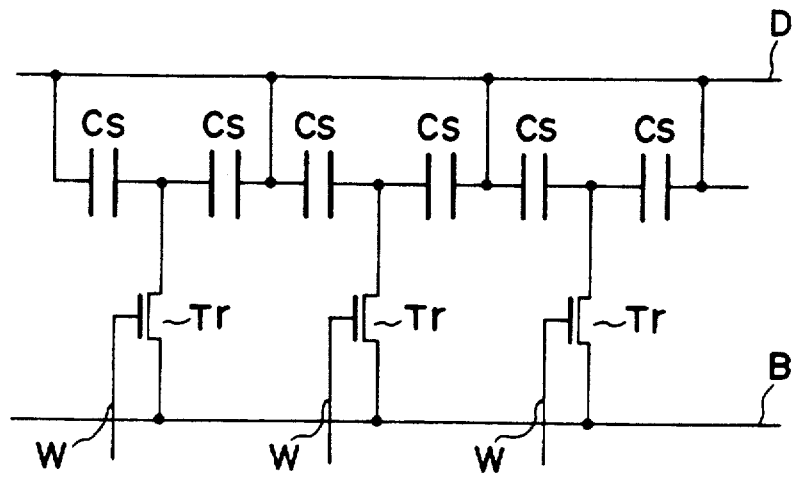
F I G. 22
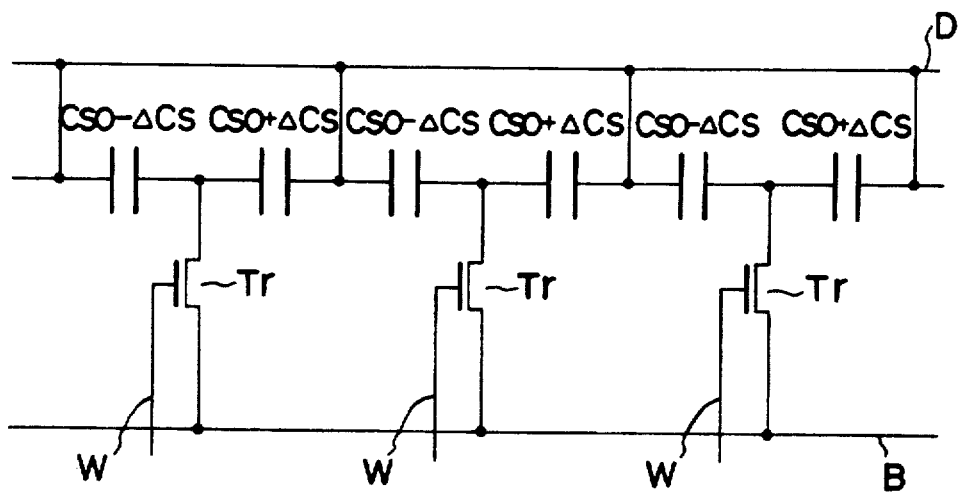
F I G. 24

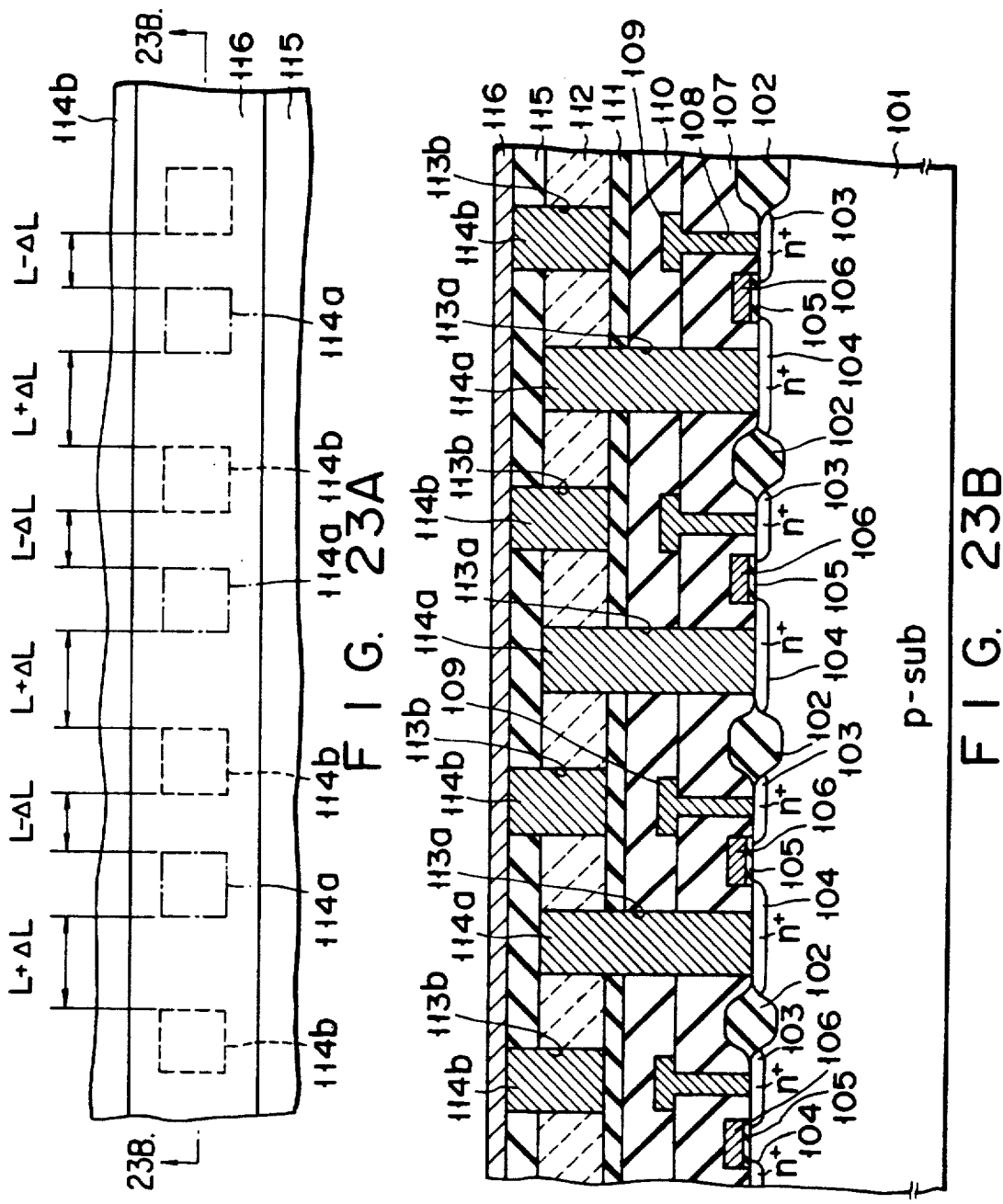

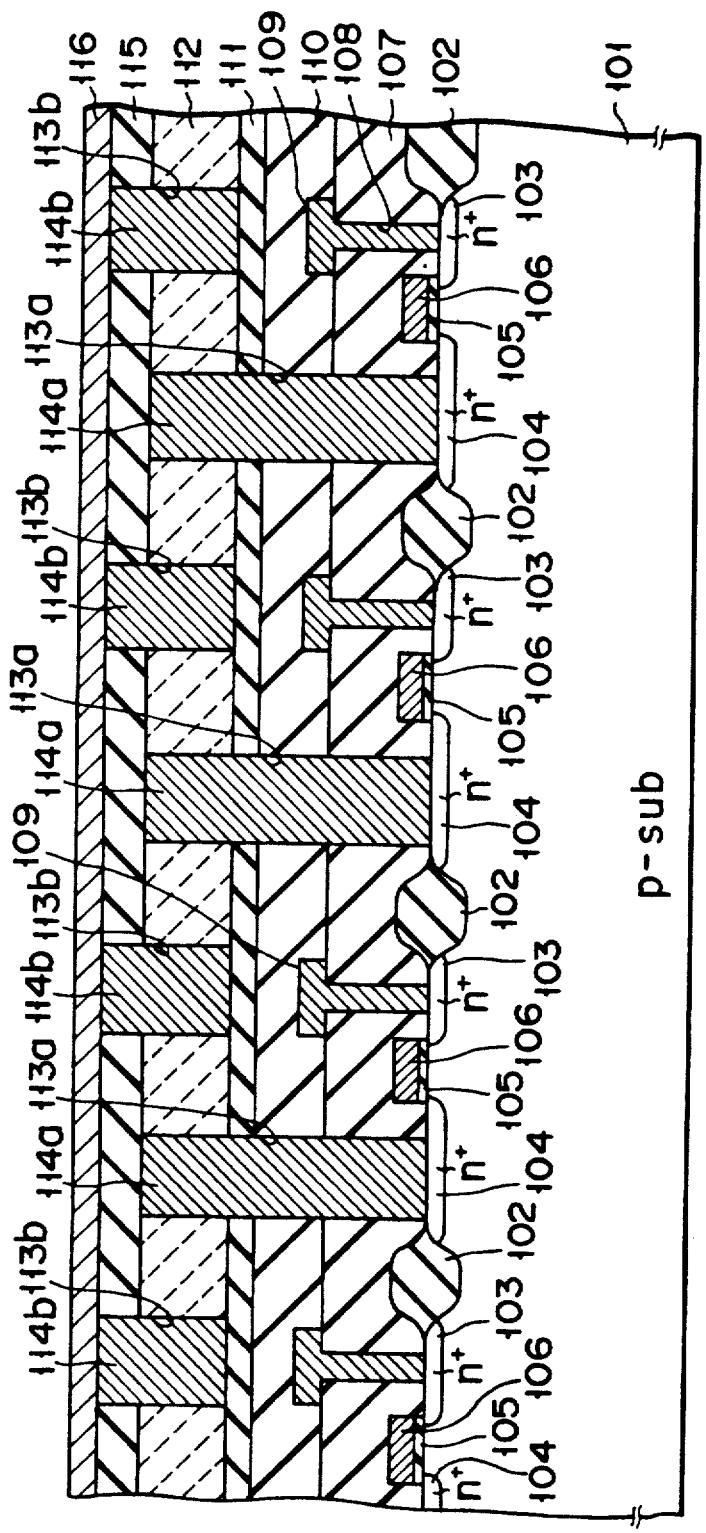
F I G. 25B

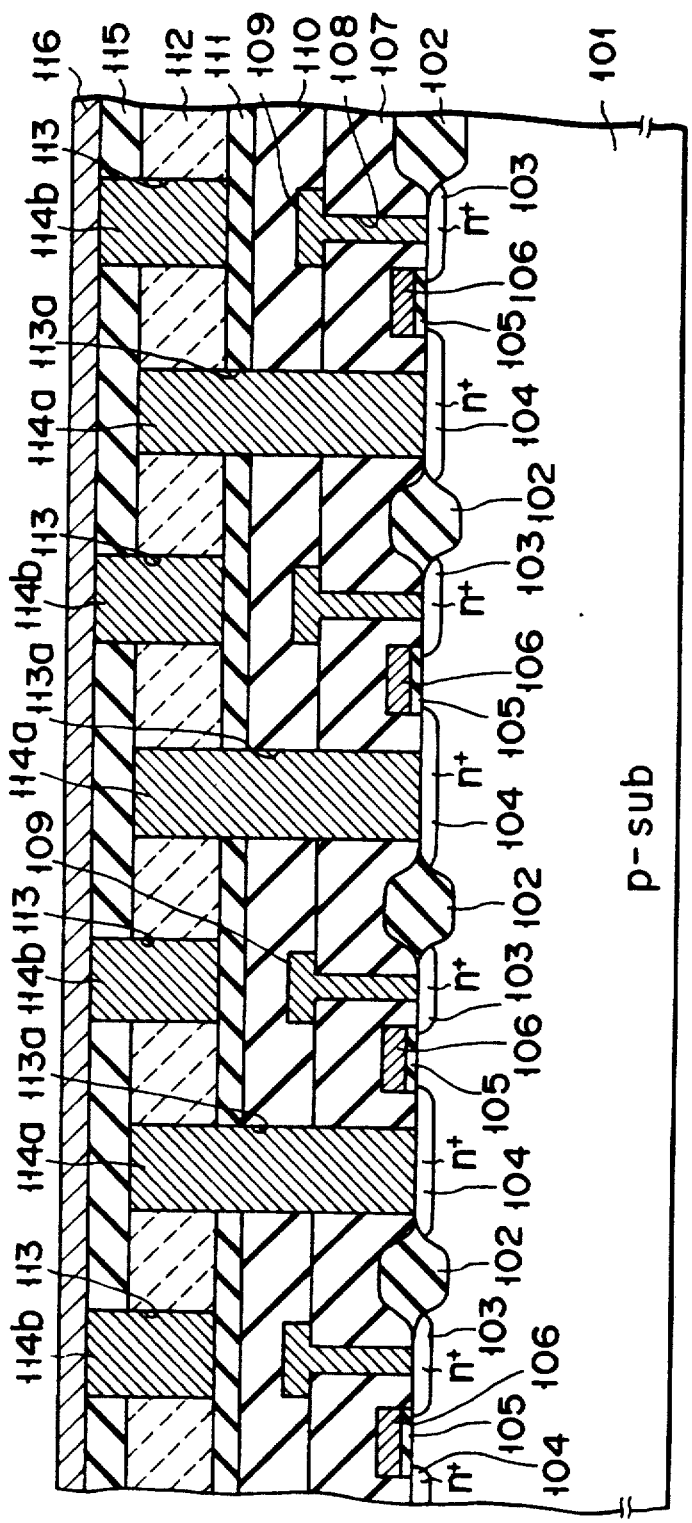
F I G. 27B

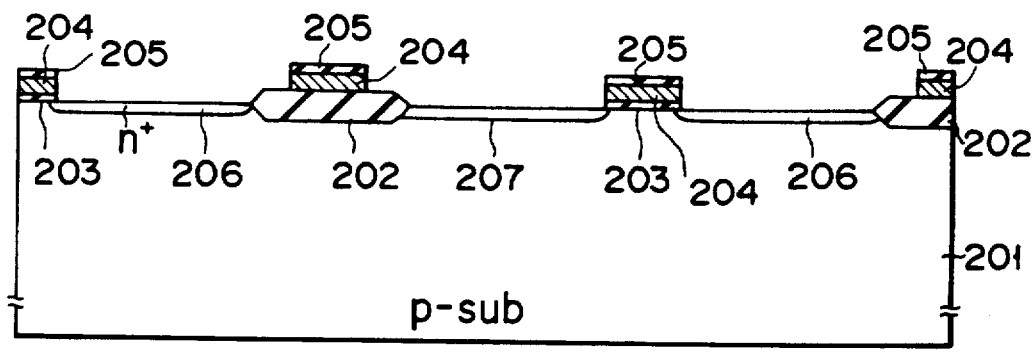
F I G. 28A
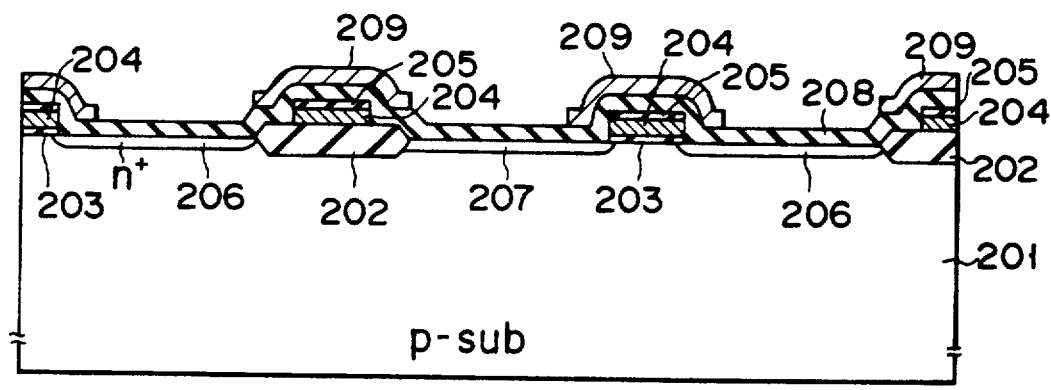
F I G. 28B
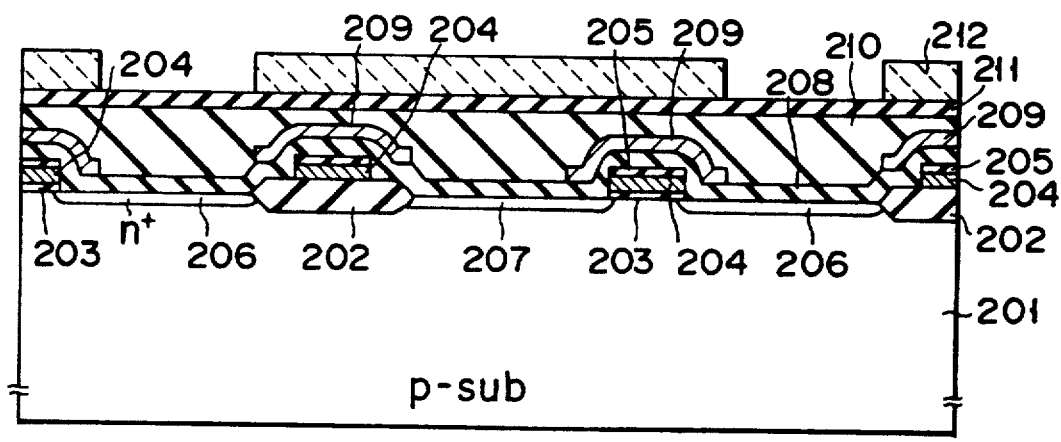
F I G. 28C

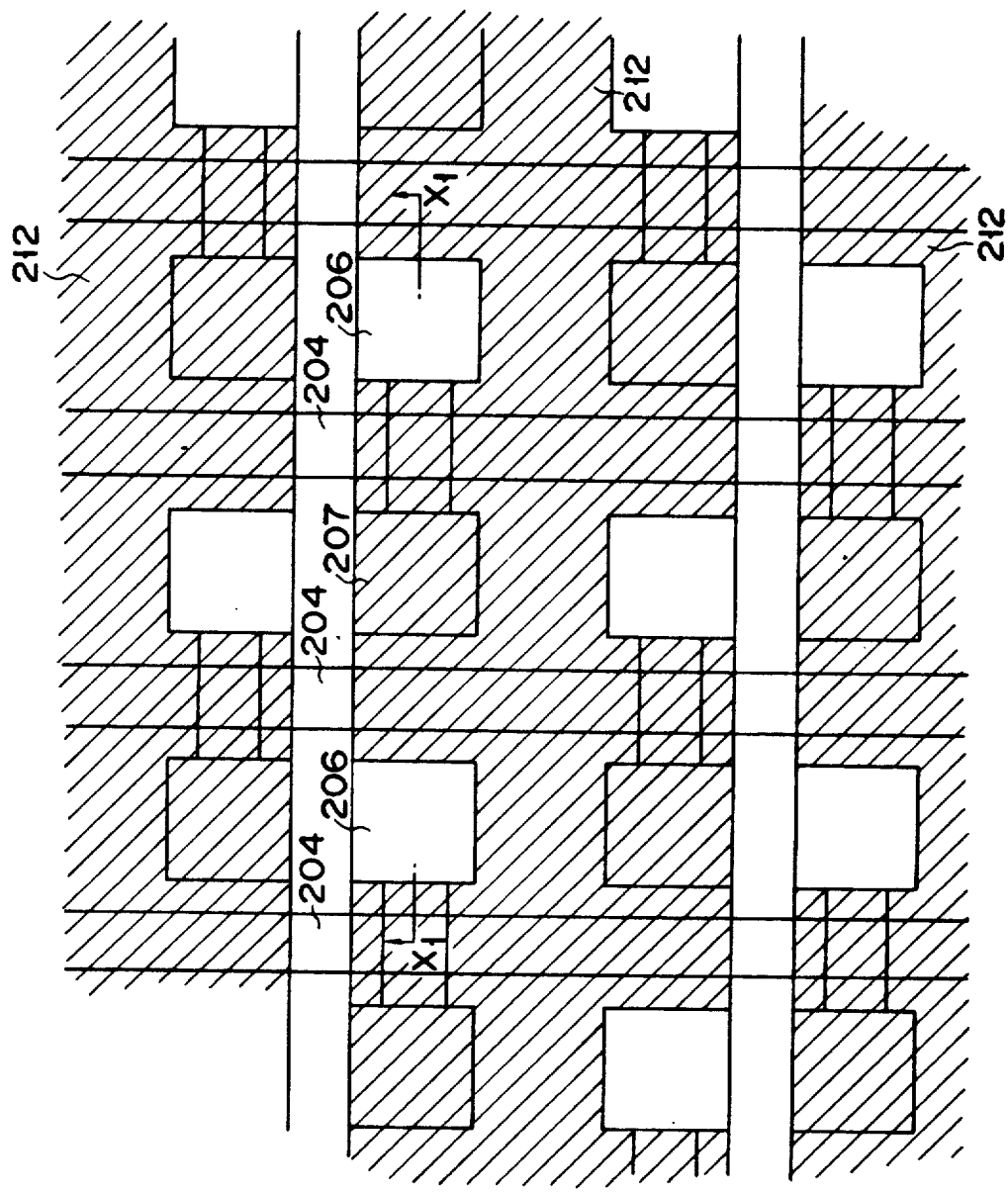
F I G. 31

FERROELECTRIC CAPACITOR AND A SEMICONDUCTOR DEVICE HAVING THE SAME

BACKGROUND OF THE INVENTION

1. Field of the Invention

The present invention relates to a ferroelectric capacitor and a semiconductor device having the same.

2. Description of the Related Art

In a semiconductor integrated circuit such as a dynamic random access memory (DRAM), a ratio of an area occupied by a capacitor in a memory cell has been increased as a capacity and a degree of integration of the IC have been increased. For this reason, a stack structure in which an electrode, a dielectric layer, and another electrode are stacked on a semiconductor substrate as a capacitor in a memory cell or a three-dimensional structure such as a trench structure in which an electrode is buried in a trench via a thin dielectric layer is adopted in, e.g., a 4-M bit DRAM. Since, however, a degree of integration is predicted to be further increased in future, it is assumed that a structure of a memory cell will be still more complicated.

For the above reasons, studies have been made to use a ferroelectric material having a high permittivity in place of an oxide or nitride of silicon which is versatilely used as a dielectric film, thereby simplifying a structure of a capacitor. For example, since the relative permittivity of lead zirconate titanate (PZT) as a typical ferroelectric material is 1,000 or more, a ferroelectric capacitor of a planar structure having the ferroelectric material can store an electric charge in a comparatively small area.

In addition, studies have been made to realize an electrically erasable nonvolatile random access memory (RAM) by using a ferroelectric capacitor. The nonvolatile RAM utilizes the fact that the ferroelectric material has hysteresis characteristics between an electric field and polarization. More specifically, the ferroelectric capacitor has relationships between an electric field E and electric polarization P as shown in FIGS. 1 and 2. FIG. 1 shows an E-P characteristic curve observed at a Curie temperature or less (ferroelectric phase), and FIG. 2 shows that observed at the Curie temperature or more (paraelectric phase). A ferroelectric capacitor having the characteristic shown in FIG. 1 holds a remanent polarization corresponding to the direction of an applied voltage even when the voltage is returned to zero. For this reason, a nonvolatile RAM having the ferroelectric capacitor is used in a state at the Curie temperature or less (ferroelectric phase) in which the capacitor exhibits the remanent polarization. The ferroelectric capacitor is allowed to store digital information by assigning the direction of an electric charge remaining in the ferroelectric material to "0" and "1". A volatile DRAM is used in a state at the Curie temperature or more (paraelectric phase) in which no remanent polarization is exhibited as shown in FIG. 2.

In addition, as is understood from the hysteresis characteristics shown in FIGS. 1 and 2, in the ferroelectric capacitor, the polarization P is no longer increased when the electric field is increased to a certain degree, i.e., a so-called polarization saturation phenomenon occurs. In the ferroelectric capacitor, therefore, even if a distance between electrodes sandwiching a ferroelectric layer is shortened, i.e., even if the thickness of the ferroelectric layer is decreased, the effect of storing a large amount of an electric charge obtained when a normal dielectric layer is used cannot be expected. On the contrary, since the dielectric strength of the ferroelectric material is comparatively low, the interelectrode distance is preferably increased to be wider than that designed when a silicon oxide or nitride is used. The interelectrode distance of the ferroelectric capacitor used in the non-volatile RAM, therefore, is preferably determined in accordance with an operation voltage, a threshold electric field (or a polarization saturation electric field) of the dielectric, a dielectric strength, and the like.

A structure shown in FIGS. 3A and 3B is known as a semiconductor device having a ferroelectric capacitor of a planar structure. Referring to FIGS. 3A and 3B, reference numeral 301 denotes a p-type silicon substrate, and a field oxide film 302 for electrically isolating an element region is formed on the surface of the substrate 301. N+-type source and drain regions 303 and 304 are formed on the surface of the substrate 301 surrounded by the field oxide film 302 so as to be electrically isolated from each other. A gate oxide film 305 is formed on the substrate 301 including a channel region formed between the source and drain regions 303 and 304, and a gate electrode 306 consisting of, e.g., polycrystalline silicon is formed on the gate oxide film 305. A first insulating interlayer 307 consisting of, e.g., $SiO_2$ is coated on the entire surface of the substrate 301 including the field oxide film 302 and the gate electrode 306. Contact holes 308 are formed in the insulating interlayer 307 at a position corresponding to portions of the source and drain regions 303 and 304 respectively. A source electrode (not shown) and a drain electrode 309 consisting of polycrystalline silicon are formed on the insulating interlayer 307 so as to be connected to the source and drain regions 303 and 304, respectively, through the contact hole 308. A first electrode 310a having a wide area is formed at the other end of the drain electrode 309. A second insulating interlayer 311 consisting of, e.g., $SiO_2$ is coated on the insulating interlayer 307 including the source electrode and the drain electrode 309. A hole 312 is formed in the insulating interlayer 311 at a position corresponding to the first electrode 310a, and a ferroelectric layer 313 consisting of, e.g., PZT is buried in the hole 312. A second electrode 310b having a wide area is formed on the second insulating interlayer 311 including the ferroelectric layer 313, and a wiring 314 arranged on the second insulating interlayer 311 is connected to the second electrode 310b.

Generally, in order to increase an amount of an electric charge to be stored in the ferroelectric capacitor, an electrode area must be increased without decreasing an interelectrode distance. For example, in order to store an electric charge Q of 300 fC in a capacitor manufactured by using a ferromagnetic having a remanent polarization $P_R$ of 0.3 $C/m^2$, the electrode area must be 1.0 $\mu m^2$. Since, however, the ferroelectric capacitor to be incorporated in the conventional semiconductor device shown in FIGS. 3A and 3B is of a planar structure, an increase in electrode area increases the area of a memory cell, thereby limiting a degree of micropatterning.

In addition, in the semiconductor device shown in FIGS. 3A and 3B, a low-permittivity layer is inevitably formed in an interface between the ferroelectric layer 313 and the underlying first insulating interlayer 307 when the ferroelectric layer 313 is formed by sputtering deposition or the like. For this reason, in a semiconductor device having such a ferroelectric capacitor, as shown in an equivalent circuit diagram of FIG. 4, a parasitic capacitor C' caused by the low-permittivity layer is connected in series with a ferroelectric capacitor C. As a result, total ferroelectric characteristics are degraded.

Furthermore, a certain type of a ferroelectric material has spontaneous polarization with respect to a specific crystal axis. For example, a ferroelectric layer in which the direction of a spontaneous polarization axis of a crystal corresponds to the surface direction is formed like in lead niobate. If a planar type capacitor as shown in FIGS. 3A and 3B is formed by using such a ferroelectric layer, no ferroelectric characteristics can be obtained since the direction of spontaneous polarization of the ferroelectric layer 313 does not correspond to the direction between the electrodes 310a and 310b.

SUMMARY OF THE INVENTION

It is an object of the present invention to provide a ferroelectric capacitor capable of storing a large amount of an electric charge in a small area.

It is another object of the present invention to provide a ferroelectric capacitor having good ferroelectric characteristics by avoiding a series connection of a parasitic capacitance.

It is still another object of the present invention to provide a ferroelectric capacitor having good ferroelectric characteristics by using even a ferroelectric layer in which the direction of a spontaneous polarization axis corresponds to the surface direction.

It is still another object of the present invention to provide a semiconductor device having a ferroelectric capacitor with the above-described characteristics.

According to the present invention, there is provided a ferroelectric capacitor comprising a ferroelectric layer formed on a substrate, a plurality of trenches formed along the direction of thickness of the ferroelectric layer with a ferroelectric material therebetween, and first and second electrodes buried in the trenches to oppose each other with the ferroelectric material therebetween.

In addition, according to the present invention, there is provided a semiconductor device comprising:

a substrate;

an insulating film formed on the substrate;

a ferroelectric capacitor constituted by a ferroelectric layer formed in the insulating film, a plurality of trenches formed in the direction of thickness of the ferroelectric layer with a ferroelectric material therebetween, and first and second electrodes buried in the trenches to oppose each other with the ferroelectric material therebetween; and a transistor formed on the substrate and connected to one of the first and second electrodes of the ferroelectric capacitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing a relationship between an electric field and polarization of a ferroelectric phase;

FIG. 2 is a graph showing a relationship between an electric field and polarization of a paraelectric phase;

FIG. 5 is a partial sectional perspective view for explaining an operation of a ferroelectric capacitor of the present invention;

FIG. 6A is a plan view showing a ferroelectric capacitor array according to Example 1 of the present invention;

FIG. 6B is a perspective view having a section along a line B—B of FIG. 6A;

FIGS. 9A to 12B are views for explaining manufacturing steps of a ferroelectric capacitor array according to Example 2 of the present invention;

FIG. 16A is a plan view showing a ferroelectric memory according to Example 4 of the present invention;

FIG. 16B is a sectional view taken along a line B—B of FIG. 16A;

FIGS. 18A to 18I are sectional views showing manufacturing steps of a ferroelectric memory according to Example 6;

FIG. 22 is an equivalent circuit diagram of the ferroelectric memory shown in FIG. 21A;

FIG. 23A is a plan view for explaining an operation of the ferroelectric memory according to Example 7;

FIG. 23B is a sectional view taken along a line B—B of FIG. 23A;

FIG. 24 is an equivalent circuit diagram of the ferroelectric memory shown in FIG. 23A;

FIG. 25B is a sectional view taken along a line B—B shown in FIG. 25A;

FIG. 27B is a sectional view taken along a line B—B of FIG. 27A;

FIGS. 28A to 28F are sectional views showing manufacturing steps of a ferroelectric memory according to Example 10 of the present invention;

FIG. 31 is a plan view of FIG. 28C.

DETAILED DESCRIPTION OF THE PREFERRED EMBODIMENT

Figure 3A:
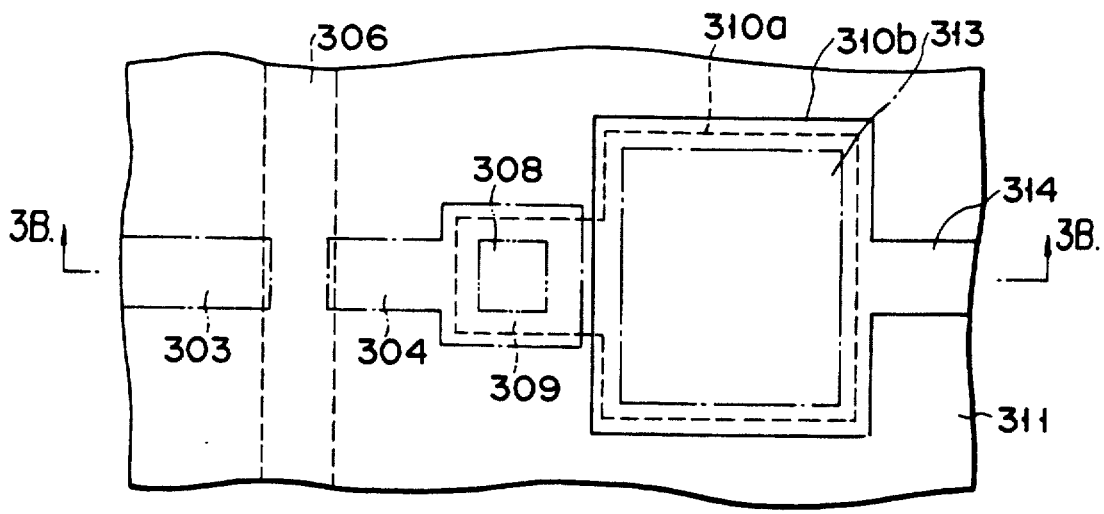
FIG. 3A is a plan view showing a semiconductor device having a conventional planar type capacitor.

A ferroelectric capacitor according to the present invention comprises a ferroelectric layer formed on a substrate, a plurality of trenches formed in the direction of thickness of the ferroelectric layer with a ferroelectric material therebetween, and first and second electrodes buried in the trenches to oppose each other with the ferroelectric material therebetween.

Examples of the substrate are a glass substrate and a silicon substrate.

Examples of the ferroelectric material are lead zirconate titanate (PZT), lead lanthanum zirconate titanate (PLZT), lead titanate, barium titanate, bismuth titanate, lead niobate, and strontium niobate of these ferroelectric materials, a ferroelectric material having a Curie temperature sufficiently higher than room temperature (i.e., a ferroelectric material which exhibits a ferroelectric phase at room temperature) can be used as a recording medium of a nonvolatile ferroelectric memory. A ferroelectric material having a Curie temperature lower than room temperature (i.e., a ferroelectric material which exhibits a paraelectric phase at room temperature) can be used as a capacitor for a memory cell of a DRAM.

The trench may have a rectangular or square opening shape. Alternatively, a trench in which one of the first and second electrodes is to be buried may have a frame-like or lattice-like opening. In the latter case, a trench having a rectangular or square opening shape is formed inside the frame-like or lattice-like opening, and the remaining one of the first and second electrodes is buried in the trench.

Examples of the material of the electrode are aluminum, polycrystalline silicon, tungsten, platinum, and gold.

The first and second electrodes can be buried in the trenches via an insulating material except for a contact portion with respect to the ferroelectric material. Examples of the insulating material are silicon oxide, silicon nitride, alumina, and magnesia.

An insulating film consisting of, e.g., silicon oxide, silicon nitride, alumina, or magnesia may be interposed between the substrate and the ferroelectric layer. Alternatively, the insulating film may be formed on the ferroelectric layer.

A semiconductor device according to the present invention comprises:

a substrate;

an insulating film formed on the substrate;

a ferroelectric capacitor constituted by a ferroelectric layer formed on the insulating film, a plurality of trenches formed in the direction of thickness of the ferroelectric layer with a ferroelectric material therebetween, and first and second electrodes buried in the trenches to oppose each other with the ferroelectric material therebetween; and a transistor formed on the substrate and connected to one of the first and second electrodes of the ferroelectric capacitor.

Examples of the substrate are a glass substrate and a silicon substrate.

Examples of the material of the insulating film are silicon oxide, silicon nitride, alumina, and magnesia (MgO). In particular, an insulating film consisting of only magnesia or having a two-layered structure in which silicon oxide and magnesia are stacked in the order named is preferable.

Examples of the transistor formed on the substrate are a MIS transistor constituted by source and drain regions formed on a silicon substrate, a gate insulating film formed on the substrate including a channel region formed between the source and drain regions, and a gate electrode formed on the insulating film, and a thin-film MIS transistor constituted by a glass substrate, a semiconductor layer formed on the substrate, source and drain regions formed on the semiconductor layer, a gate insulating film formed on the substrate including a channel region formed between the source and drain regions, and a gate electrode formed on the insulating film.

The transistor is connected to one of the first and second electrodes of the ferroelectric capacitor as follows.

(1) The bottom portion of one of the trenches in which the first and second electrodes are to be buried is allowed to extend through the ferroelectric film and the insulating film to reach the source or drain region of the transistor formed on the surface of the substrate, thereby connecting the electrode buried in one trench to the region.

(2) A wiring layer is formed in or on the insulating film on the substrate and connected to the source or drain region of the transistor formed on the substrate through a contact hole formed in the insulating film. In addition, the bottom portion of one of the trenches is allowed to reach the surface of the wiring layer, thereby connecting the electrode buried in one trench to the wiring layer.

In the structure in which one of the first and second electrodes of the ferroelectric capacitor is connected to the transistor, the other electrode is connected to a wiring layer arranged on the surface of the ferroelectric layer of the capacitor. Alternatively, it is connected to the wiring layer formed in or on insulating film located on the substrate. Such a wiring layer may be directly formed on the ferroelectric layer or formed on the insulating film formed on the ferroelectric layer and consisting of, e.g., magnesia or silicon oxide. In the case where one of the first and second electrodes of the ferroelectric capacitor is connected to the wiring layer which is connected to the transistor, the other electrode is connected to the wiring layer arranged on the surface of the ferroelectric layer of the capacitor.

A semiconductor device according to the present invention comprises:

a substrate;

an insulating film formed on the substrate;

a ferroelectric capacitor constituted by a ferroelectric layer formed on the insulating layer, a plurality of trenches formed in the direction of thickness of the ferroelectric layer with a ferroelectric material therebetween, and first and second electrodes alternately buried in the trenches to oppose each other with the ferroelectric material therebetween;

a transistor formed on the substrate and connected to the first electrode of the ferroelectric capacitor; and a wiring layer, formed on the ferroelectric layer of the ferroelectric capacitor, for commonly connecting the second electrode of the capacitor.

In order to alternately bury the first and second electrodes in the trenches to oppose each other with the ferroelectric material therebetween: (1) square pillar-like second electrodes are arranged on four sides of a square pillar-like first electrode; (2) square pillar-like second electrodes are arranged on three sides of a square pillar-like first electrode; or (3) square pillar-like first and second electrodes are alternately arranged in both the row and column directions.

Since the ferroelectric capacitor according to the present invention comprises a ferroelectric layer formed on a substrate, a plurality of trenches formed in the direction of thickness of the ferroelectric layer with a ferroelectric material therebetween, and first and second electrodes buried in the trench portions to oppose each other with the ferroelectric material therebetween, a large amount of an electric charge can be stored in a small area. For example, assume that a capacitor having a ferroelectric layer with remanent polarization of 0.3 $C/m^2$ is manufactured to design a capacitor capable of storing an electric charge of 300 fC. In this case, an electrode area of this capacitor must be 1.0 $\mu m^2$. In order to realize this electrode area by using a conventional planar structure in which a ferroelectric layer is vertically sandwiched between electrodes, since an electrode having an area of, e.g., $1.0 \times 1.0$ $\mu m$ must be formed, the capacitor occupies the same area of $1.0 \times 1.0$ $\mu m$. In a ferroelectric capacitor according to the present invention as shown in FIG. 5, however, a 2-$\mu m$ thick ferroelectric layer 2 is formed on a substrate 1, two trenches 3a and 3b each having an opening area of $0.5 \times 0.2$ $\mu m$ and a depth of 2.0 $\mu m$ are formed with an interval of 0.1 $\mu m$ therebetween, and a metal is buried in the trenches 3a and 3b to form first and second electrodes 4a and 4b. As a result, an effective electrode area becomes 1.0 $\mu m^2$. Since an area occupied by the capacitor becomes $0.5 \times 0.5$ $\mu m$ by adopting such a structure, the area of the capacitor can be suppressed to be ¼ that of the capacitor of the conventional planar structure having the same electrode area.

In addition, since a plurality of trenches are formed in the ferroelectric layer formed on the substrate in the direction of thickness of the ferroelectric layer with the ferroelectric material therebetween, and the first and second electrodes are buried in the trenches to oppose each other with the ferroelectric material therebetween, a parasitic capacitance caused by a low-permittivity layer inevitably produced between the ferroelectric layer and the underlying layer upon deposition of the ferroelectric layer is connected not in series but in parallel with a ferroelectric capacitance. As a result, a ferroelectric capacitor excellent in ferroelectric characteristics can be obtained.

Furthermore, according to the present invention, an electric field is applied along the surface direction of a ferroelectric layer. Therefore, even if a ferroelectric layer in which the direction of a spontaneous polarization axis corresponds to only the surface direction is used, a ferroelectric capacitor having good ferroelectric characteristics can be realized.

Since the first and second electrodes are buried in the trenches via an insulating material having a low permittivity electrical isolation can be obtained by the insulating material between the capacitors and between the capacitor and the wiring layer. Therefore, a capacitor array which minimizes an erroneous operation and has a short delay time caused by a stray capacitance can be realized by arranging and integrating a large number of capacitors on a single substrate. That is, since the side and bottom surfaces except for the upper surface and oppose sides of the electrode are buried in the insulating material, a region on the insulating material can be used as a wiring layer region. In this case, one of the first and second electrode of the capacitor is extracted on the insulating layer to form a wiring layer serving as a common electrode together with a similarly extracted electrode of another capacitor.

If a large amount of impurities of an alkali metal such as Na or K or a heavy metal such as Fe or Cu or crystal defects is contained in a ferroelectric layer constituting the ferroelectric capacitor, not only initial characteristics (a permittivity and E-P hysteresis characteristics) are changed, but also the impurities or defects are easily moved as mobile ions by diffusion or drift during an operation. As a result, a deterioration over time is caused in dielectric characteristics and ferroelectric characteristics to degrade the reliability of the ferroelectric material. In addition, an impurity contained in the form of a solid solution at a lattice position or an interstitial position in a crystal of the ferroelectric material produces an impurity level in a forbidden band of the ferroelectric material and serves as a center of an electron-hole recombination. As a result, a leakage current of the ferroelectric capacitor is increased.

Figure 3B:
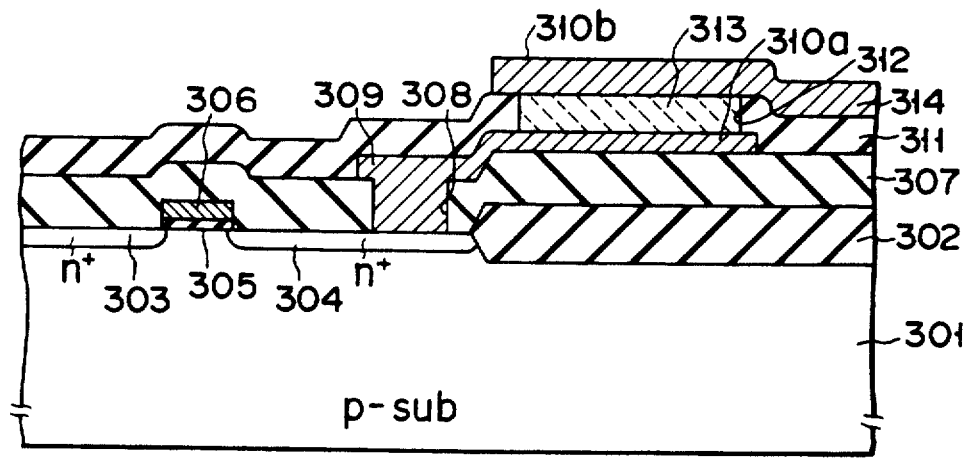
FIG. 3B is a sectional view taken along a line B—B of FIG. 3A.
Figure 4:
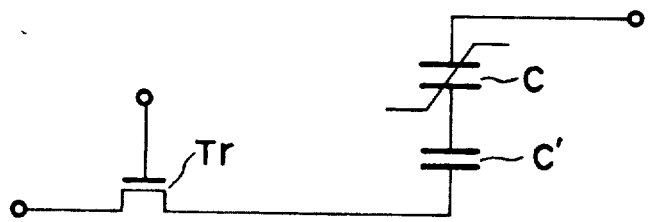
FIG. 4 is an equivalent circuit diagram of the semiconductor device shown in FIG. 3A.

In the ferroelectric capacitor of a conventional planar structure shown in FIGS. 3A and 3B, since the first and second electrodes are arranged on the upper and lower surfaces of the ferroelectric layer, the impurities or crystal defects are easily segregated in interfaces between the ferroelectric layer and the electrodes. As a result, gettering performed by annealing may degrade the dielectric characteristics and the ferroelectric characteristics of the ferroelectric capacitor.

In the ferroelectric capacitor according to the present invention, however, when the insulating film consisting of silicon oxide or the like is formed on the lower surface or the upper and lower surfaces of the ferroelectric layer and annealing is performed in a desired atmosphere at a predetermined temperature, impurities or crystal defects in the ferroelectric layer can be segregated in an interface between the ferroelectric layer and the insulating film or in the insulating film. In the ferroelectric capacitor, a plurality of trenches are formed in the direction of thickness of the ferroelectric layer, the first and second electrodes are buried in the trenches, and an electric field is applied between the first and second electrodes in the surface direction of the ferroelectric layer. As a result, since the impurities or defects segregated in the interface between the ferroelectric layer and the insulating layer are prevented from being diffused or drifted as mobile ions into the ferroelectric layer between the electrodes, a ferroelectric capacitor having good dielectric characteristics and ferroelectric characteristics can be obtained.

A semiconductor device according to the present invention comprises: a substrate; an insulating layer formed on the substrate; a ferroelectric capacitor constituted by a ferroelectric layer formed on the insulating film, a plurality of trenches formed in the direction of thickness of the ferroelectric layer with a ferroelectric material therebetween, and first and second electrodes buried in the trenches with the ferroelectric material therebetween; and a transistor formed on the substrate and connected to one of the first and second electrodes. The semiconductor device of the present invention, therefore, can achieve various excellent characteristics described below.

(1) highly integrated DRAM or ferroelectric memory in which a large number of ferroelectric capacitors are arranged on a single substrate can be realized. That is, in a DRAM or ferroelectric memory, memory cells are arranged in a matrix manner. Each memory cell is constituted by one or two capacitors and one or two transistors formed on a silicon substrate. A first electrode of the ferroelectric capacitor is connected to the transistor on the substrate, and its second electrode is connected to a common wiring layer. In such a structure, a gate electrode of the transistor is connected to a word line in the Y direction and the first electrode of the ferroelectric capacitor is connected to a bit line in the X direction via the transistor, to select specific word and bit lines, thereby accessing a specific memory cell.

(2) By connecting the first electrode of the ferroelectric capacitor to the source or drain region of the transistor formed on the substrate, formation of a wiring layer on the surface of the ferroelectric layer can be omitted, and the length of the wiring layer can be shortened. The second electrode is extracted from a wiring layer on an upper portion of the ferroelectric layer or in the insulating film or between the insulating film and the ferroelectric layer. The second electrodes connected to a common wiring layer may be formed in ferroelectric capacitors arranged on only the same row or column or in all of arranged ferroelectric capacitors. In the former wiring layer structure, the common wiring layer connected to the second electrodes can be used as, e.g., a drive line of a ferroelectric memory. In the latter structure, the common wiring layer connected to the second electrodes can be used as, e.g., a plate line of a DRAM. By using these wiring layer structures, therefore, a highly integrated DRAM or ferroelectric memory in which memory cells having ferroelectric capacitors are integrated can be realized.

(3) When a wiring layer is formed on the upper surface of the ferroelectric layer and connected to one of the first and second electrodes, when the upper end of one electrode is projected from the ferroelectric material and the electrode itself is used to form a wiring layer crossing the ferroelectric material, or when the upper end of the electrode is formed to cove the ferroelectric layer, electric field concentration occurs at a portion of the wiring layer or the like covering the surface of the ferroelectric layer near the electrode upon application of a voltage to the ferroelectric layer through the wiring layer. In this case, the electric field concentration can be avoided by arranging an insulating film having a low permittivity on the upper surface of the ferroelectric layer.

A semiconductor device according to the present invention comprises a substrate; an insulating film formed on the substrate; a ferroelectric capacitor constituted by a ferroelectric layer formed on the insulating film, a plurality of trenches formed in the direction of thickness of the ferroelectric layer with a ferroelectric material therebetween, and first and second electrodes buried in the trenches with the ferroelectric material therebetween; a transistor formed on the substrate and connected to the first electrode of the ferroelectric capacitor; and a wiring layer, formed on the ferroelectric layer of the ferroelectric capacitor, for commonly connecting the second electrode of the capacitor. Since, therefore, at least two second electrodes can be arranged opposite to the first electrode, the ferroelectric capacitor can have at least two capacitances with respect to the first electrode. In addition, a crosstalk between the first electrodes can be suppressed by the second electrode arranged therebetween. As a result, a ferroelectric memory comprising compact ferroelectric capacitors having a high density and high reliability can be realized.

DESCRIPTION OF THE PREFERRED EMBODIMENTS

The present invention will be described in more detail below by way of its examples.

EXAMPLE 1

FIG. 6A is a plan view showing a ferroelectric capacitor array according to Example 1, and FIG. 6B is a perspective view showing a section taken along a line B—B of FIG. 6A. Referring to FIGS. 6A and 6B, reference numeral 11 denotes a silicon substrate, and a silicon oxide film 12 grown by, e.g., thermal oxidation is coated on the surface of the substrate 11. A 5,000-Å thick MgO buffer layer 13 deposited by, e.g., a CVD method and serving as an insulating film is coated on the silicon oxide film 12. This buffer layer 13 has an effect of preventing Pb or the like in a ferroelectric layer (to be described below) from being diffused or reacted to the substrate 11 during a process. A 2-μm thick ferroelectric layer 14 consisting of lead zirconate titanate is coated on the buffer layer 13 by, e.g., RF sputtering. This ferroelectric layer 14 is formed by RF sputtering at 600° C. using a ceramic target having a composition of $Pb(Zr_{0.52}Ti_{0.48})O_3$.

Two rectangular pillar-like trenches 15a and 15b having a length of 1.0 μm, a width of 0.5 μm, and a depth of 2 μm are formed in the ferroelectric layer 14 at an interval of about 0.5 μm. A plurality of pairs (e.g., 500 pairs) of trenches 15a and 15b are formed in the ferroelectric layer 14. The trenches 15a and 15b are formed by lithography according to ion etching using a chlorine-based reactive gas. First and second electrodes 16a and 16b consisting of metal tungsten are buried in the trenches 15a and 15b, respectively. These electrodes 16a and 16b are formed by a CVD method of reducing, e.g., tungsten hexafluoride by hydrogen gas. Al wiring layers 17a and 17b are formed on the ferroelectric layer 14. Ends of the wiring layers 17a and 17b are connected to a plurality of pairs of the first and second electrodes 16a and 16b exposed on the surface of the ferroelectric layer 14, and the other ends thereof are commonly connected to a single wiring layer.

According to the capacitor array having the above arrangement, since a plurality of capacitors in each of which the first and second electrodes 16a and 16b are buried in a pair of trenches 15a and 15b, respectively, to sandwich a portion of the ferroelectric layer 14 located between the trenches 15a and 15b are arranged on the ferroelectric layer 14, a large amount of an electric charge can be stored in a small area.

Figure 7:
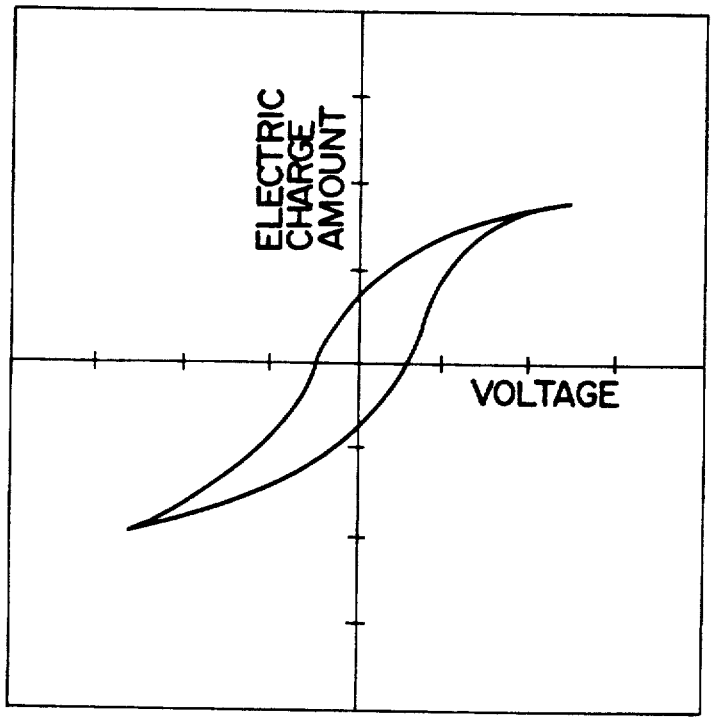
FIG. 7 is a graph showing hysteresis characteristics between a voltage and an electric charge amount of the ferroelectric capacitor according to Example 1.

When a voltage was applied across the first and second electrodes 16a and 16b by using the common wiring layers 17a and 17b in the capacitor array having the above arrangement, a hysteresis characteristic between a voltage and an electric charge amount shown in FIG. 7 was obtained. FIG. 7 reveals that a capacitor constituted by the first and second electrodes 16a and 16b and the portion of the ferroelectric layer 14 located between the electrodes 16a and 16b has memory characteristics.

Figure 8A:
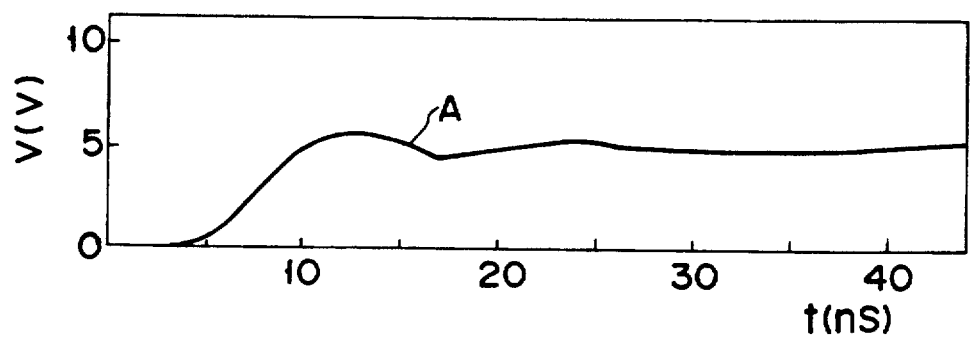
FIG. 8 is a graph showing switching characteristics of the ferroelectric capacitor according to Example 1.
Figure 8B:
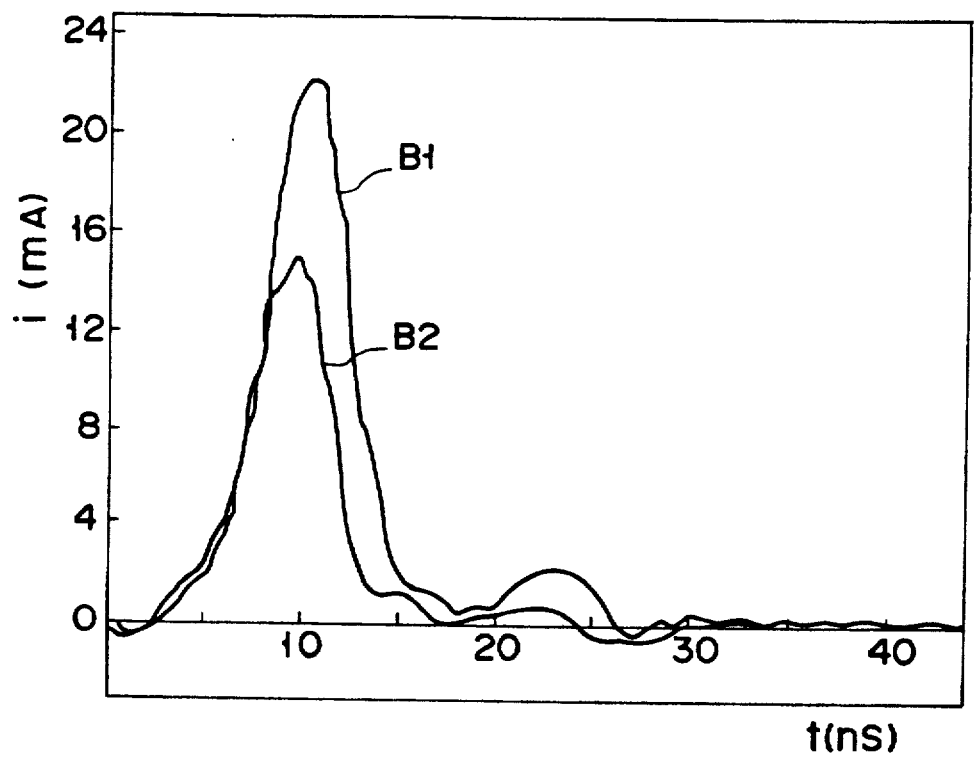

In addition, square-wave pulses were applied between the first and second electrodes 16a and 16b of the capacitor to observe a transient current flowing through the capacitor. As a result, a switching characteristic shown in FIG. 8 was obtained. Referring to FIG. 8, symbol A denotes an applied voltage waveform; $B_1$, an inverted current waveform; and $B_2$, a non-inverted current waveform. FIG. 8 also reveals that each capacitor of Example 1 has memory characteristics and a time required for polarization inversion is about 10 ns.

EXAMPLE 2

In Example 2, the present invention is applied to a ferroelectric capacitor array. This array will be described with reference to manufacturing steps shown in FIGS. 9A to 12B.

Figure 9A:
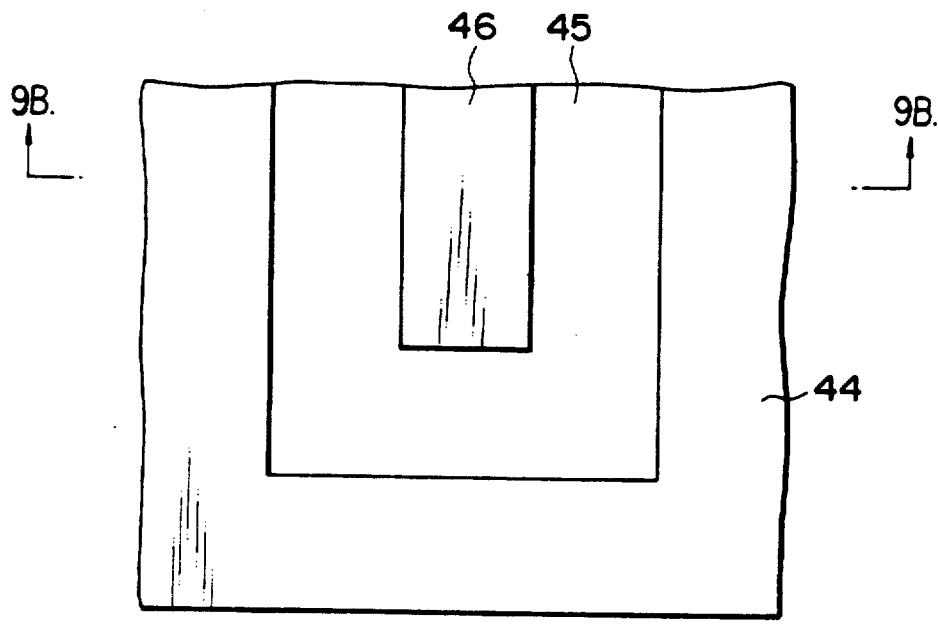
Figure 9B:
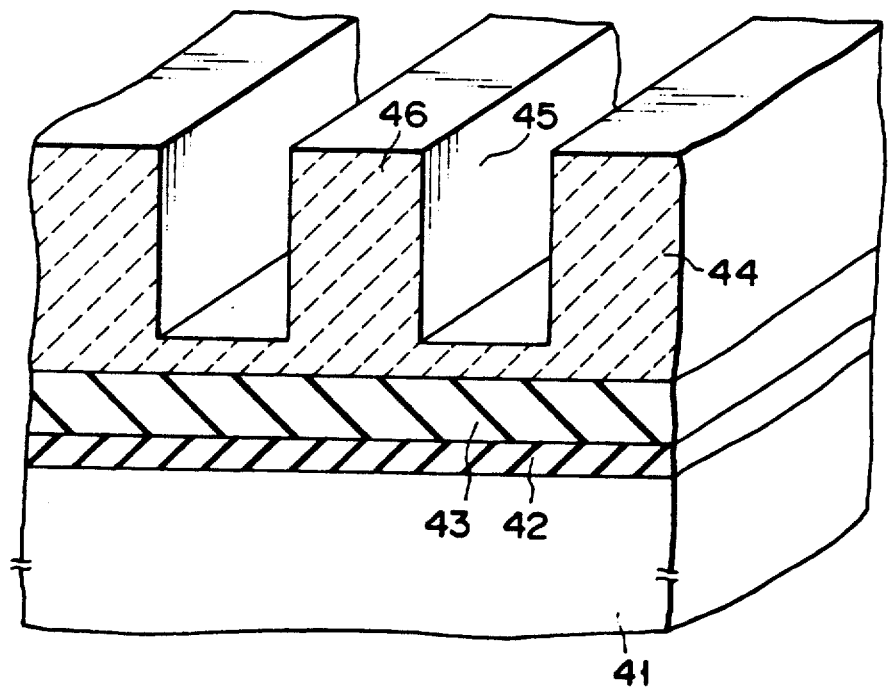

First, a silicon substrate 41 was thermally oxidized to grow a silicon oxide film 42 on its surface, and a 5,000-Å thick MgO buffer layer 43 as an insulating film was deposited on the silicon oxide film 42 by a CVD method. Subsequently, a ceramic target having a composition of $Pb(Zr_{0.52}Ti_{0.48})O_3$ was used to perform RF sputtering at 600° C. on the buffer layer 43, thereby coating a 2.5-μm thick ferroelectric layer 44 consisting of lead zirconate titanate on the buffer layer 43. Subsequently, the ferroelectric layer 44 was selectively etched by lithography according to ion etching using a chlorine-based reactive gas to form a frame-like trench 45 having a width of 1 μm and a depth of 2 μm, thereby forming a rectangular pillar 46 as shown in FIGS. 9A and 9B. Note that FIG. 9A is a plan view and FIG. 9B is a perspective view showing a section taken along a line B—B of FIG. 9A.

Figure 10A:
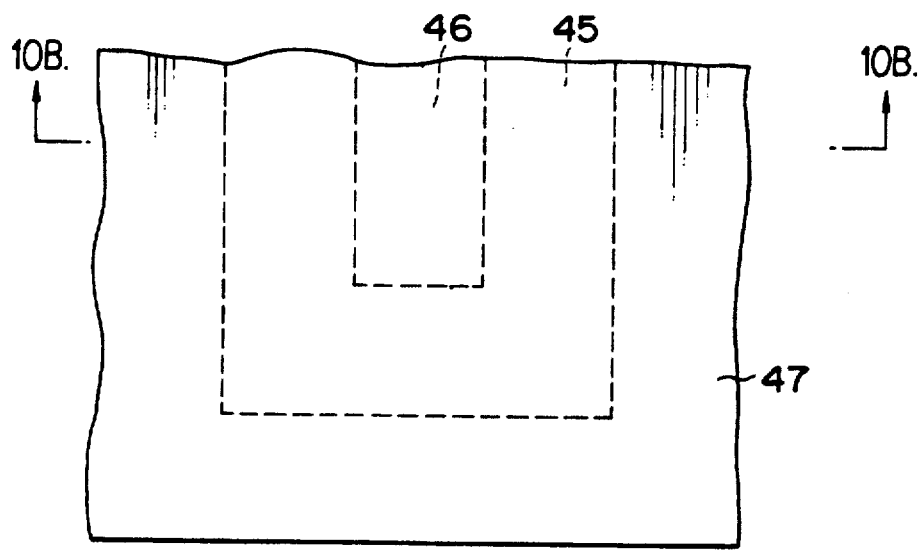
Figure 10B:
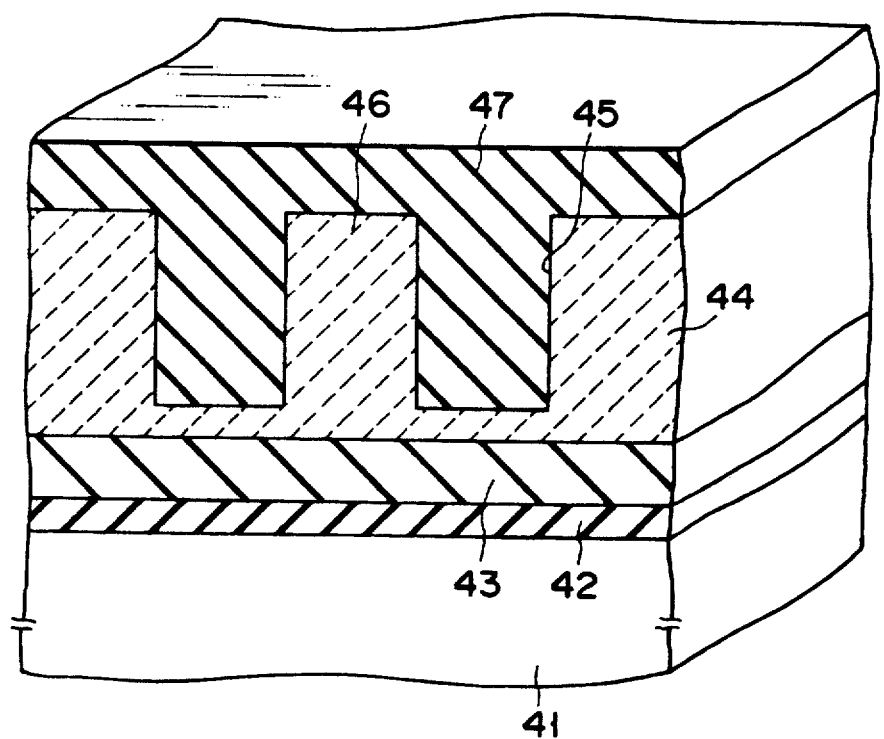

As shown in FIGS. 10A and 10B, a plasma $SiO_2$ film 47 was deposited on the ferroelectric layer 44 including the frame-like trench 45 by a plasma CVD method using $SiH_4$ and $N_2O$ as source gases. Note that FIG. 10A is a plan view and FIG. 10B is a perspective view showing a section taken along a line B—B of FIG. 10A.

Subsequently, portions of the plasma $SiO_2$ film 47 and the rectangular pillar 46 consisting of a ferroelectric material were selectively etched by lithography according to ion etching using a chlorine-based reactive gas, thereby forming a plurality of pairs (e.g., 500 pairs) of trenches 48a and 48b each having a width of 0.5 μm, a length of 1.0 μm, and a depth of 1.8 μm, as shown in FIGS. 11A and 11B. Note that FIG. 11A is a plan view and FIG. 11B is a perspective view having a section taken along a line B—B of FIG. 11A.

First and second electrodes 49a and 49b consisting of metal tungsten were buried in each pair of the trenches 48a and 48b by a CVD method of reducing tungsten hexafluoride by hydrogen gas. Subsequently, an Al film was deposited on the entire surface of the plasma $SiO_2$ film 47 and patterned to form Al wiring layers 50a and 50b as shown in FIGS. 12A and 12B. Ends of these wiring layers 50a and 50b were connected to a plurality of pairs of the first and second electrodes 49a and 49b exposed on the surface of the plasma $SiO_2$ film 47, and the other ends thereof were connected to common wiring layers 51a, 51b. Note that FIG. 12A is a plan view and FIG. 12B is a perspective view showing a section taken along a line B—B of FIG. 12A.

According to the ferroelectric capacitor array having the above arrangement, since a plurality of capacitors in which the first and second electrodes 49a and 49b are buried in the trenches 48a and 48b, respectively, to sandwich a portion of the ferroelectric layer 44 located between the trenches 48a and 48b are arranged on the ferroelectric layer 44, a large amount of an electric charge can be stored in a small area.

When a voltage was applied across the first and second electrodes 49a and 49b through the common wiring layers 51a and 51b in the ferroelectric capacitor array having the above arrangement, the hysteresis characteristic between a voltage and an electric charge shown in FIG. 7 described above was obtained, i.e., it was confirmed that each capacitor had memory characteristics. In addition, when square-wave pulses were applied between the first and second electrodes 49a and 49b of the capacitor to observe a transient current flowing through the capacitor, the switching characteristic shown in FIG. 8 described above was obtained. That is, it was confirmed that each capacitor had memory characteristics and a time required for polarization inversion was about 10 ns.

EXAMPLE 3

Figure 13:
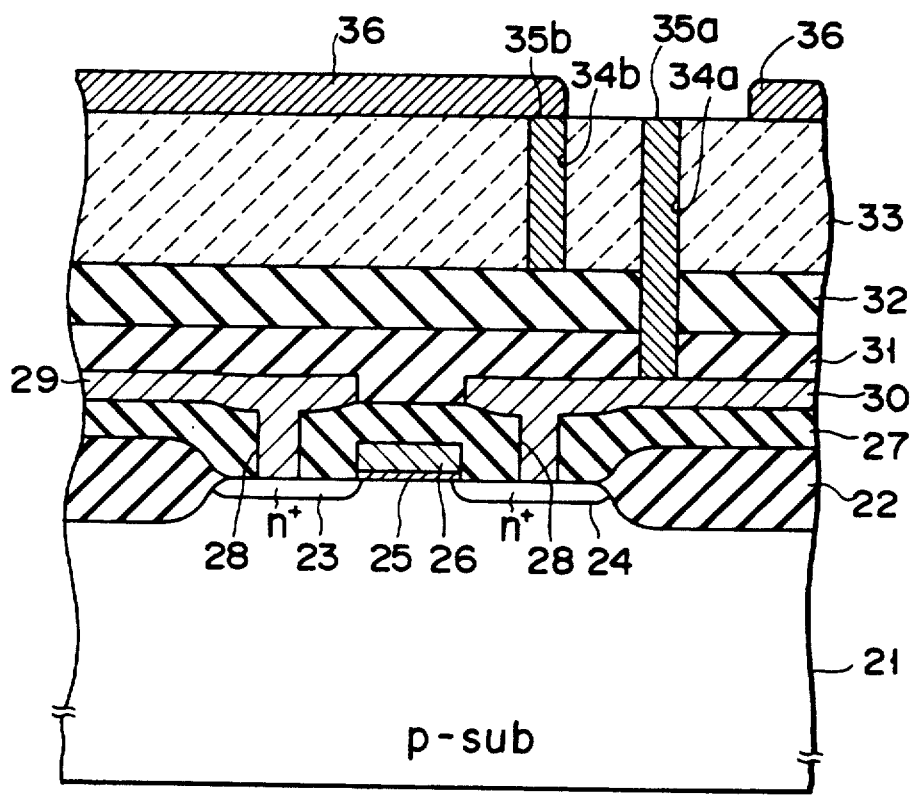
FIG. 13 is a sectional view showing a ferroelectric memory according to Example 3 of the present invention.

FIG. 13 is a sectional view showing a ferroelectric memory having a plurality of ferroelectric capacitors according to Example 3. Referring to FIG. 13, reference numeral 21 denotes, e.g., a p-type silicon substrate, and a field oxide film 22 for electrically isolating an element region is formed on the surface of the substrate 21. N+-type source and drain regions 23 and 24 are formed to be electrically isolated from each other on the surface of the substrate 21 surrounded by the field oxide film 22. A gate oxide film 25 is formed on the substrate 21 including a channel region formed between the source and drain regions 23 and 24, and a gate electrode 26 consisting of, e.g., polycrystalline silicon is formed on the gate oxide film 25. The source and drain regions 23 and 24, the gate oxide film 25, and the gate electrode 26 constitutes a MOS transistor. A first insulating interlayer 27 consisting of, e.g., $SiO_2$ is coated on the entire surface of the substrate 21 including the field oxide film 22 and the gate electrode 26. Contact holes 28 are formed in the insulating interlayer 27 at positions corresponding to portions of the source and drain regions 23 and 24. Source and drain electrodes 29 and 30 consisting of polycrystalline silicon are formed on the insulating interlayer 27 and connected to the source and drain regions 23 and 24, respectively, through the contact holes 28.

Figure 14:
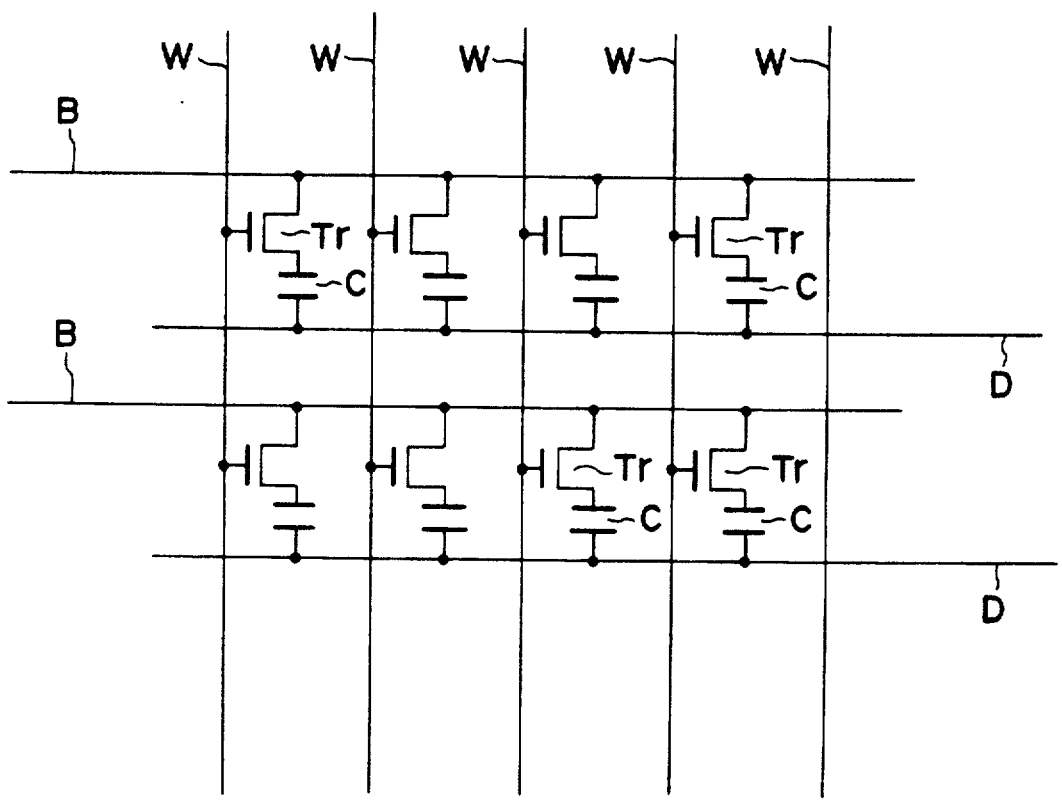
FIG. 14 is an equivalent circuit diagram of the ferroelectric memory shown in FIG. 13.

A second insulating interlayer 31 consisting of, e.g., SiO₂ is coated on the insulating interlayer 27 including the source and drain electrodes 29 and 30. A 5,000-Å thick MgO buffer layer 32 deposited by, e.g., a CVD method and serving as an insulating film is coated on the insulating interlayer 31. A ferroelectric layer 33 consisting of, e.g., 2-μm thick lead zirconate titanate was coated on the buffer layer 32. A rectangular trench 34a reaching the surface of the drain electrode 30 through the buffer layer 32 and the second insulating interlayer 31 and a rectangular trench 34b reaching the surface of the buffer layer 32 were formed in the ferroelectric layer 33 at an interval of about 0.5 μm. The trenches 34a, 34b have a length of 1.0 μm, a width of 0.5 μm. A plurality of pairs of trenches 34a and 34b are formed in the ferroelectric layer 33. First and second electrodes 35a and 35b consisting of metal tungsten are buried in the trenches 34a and 34b, respectively. The first electrode 35a is directly connected to the drain electrode 30 below the ferroelectric layer 33. Al wiring layers 36 is formed on the ferroelectric layer 33, and one end of the wiring layers 36 are connected to the second electrodes 35b of a plurality of pairs of electrodes exposed on the surface of the ferroelectric layer 33 in the column direction. With these wiring layers arrangement, the first electrodes 35a are connected to the drain region 24 of the MIS transistors, respectively, formed on the substrate 21, and the second electrodes 35b are connected to the wiring layers 36, respectively, on the surface of the ferroelectric layer 33. Such a ferroelectric memory is represented by an equivalent circuit shown in FIG. 14. Referring to FIG. 14, reference symbol Tr denotes a MOS transistor constituted by the source and drain regions 23 and 24, the gate oxide film 25, and the gate electrode 26; C, a ferroelectric capacitor constituted by the first and second electrodes 35a and 35b and a portion of the ferroelectric layer 33 sandwiched between the first and second electrodes 35a and 35b; B, a bit line connected to the source electrode 29; W, a word line connected to the gate electrode 26 of the transistor Tr; and D, a drive line (or a plate line) as the wiring layer 36.

With this arrangement, since a plurality of capacitors in each of which the first and second electrodes 35a and 35b are buried in the trenches 34a and 34b, respectively, formed in the ferroelectric layer 33 to sandwich the portion of the ferroelectric layer 33 located between the trenches 34a and 34b are arranged on the ferroelectric layer 33, a large amount of an electric charge can be stored in a small area. In addition, since the first electrode 35a connected to the drain electrode 30 located below the ferroelectric layer 33 and connected to the drain region 24 of the silicon substrate 21, formation of a wiring layer on the surface of the ferroelectric layer 33 can be omitted, and the length of the wiring layer can be shortened. By adopting these electrode and wiring layer structures of a capacitor, therefore, a ferroelectric memory in which memory cells having ferroelectric capacitors are integrated at a high density can be realized.

Furthermore, when a peripheral circuit is formed on the silicon substrate 21 of the above ferroelectric memory, information can be written in and read out from an arbitrary one of a plurality of memory cells arranged in a matrix manner and can be stored.

Figure 15:
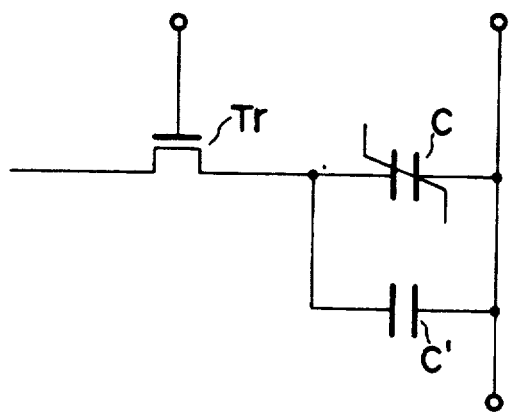
FIG. 15 is an equivalent circuit diagram of the ferroelectric memory shown in FIG. 13.

A low-permittivity layer is inevitably formed in an interface between the ferroelectric layer 33 and the underlying buffer layer 32. In this structure in which the low-permittivity layer is formed in the interface between the ferroelectric layer 33 and the buffer layer 32, the rectangular trenches 34a and 34b are formed through the interface between the ferroelectric layer 33 and the buffer layer 32, and the first and electrodes 35a and 35b are buried in the trenches 34a and 34b, respectively, so that the electrodes 35a and 35b vertically or almost vertically oppose the low-permittivity layer. As a result, as shown in an equivalent circuit diagram of FIG. 15, a parasitic capacitance C' caused by the low-permittivity layer is connected in parallel with a ferroelectric capacitor C. Since, therefore, a series connection of a parasitic capacitance as in the ferroelectric capacitor of a conventional planar type shown in FIGS. 3A and 3B can be avoided, a ferroelectric capacitor excellent in ferroelectric characteristics can be obtained. Such an effect can be similarly obtained in a ferroelectric capacitor in which first and second electrodes reach an interface between a buffer layer and a ferroelectric layer as in Example 1 or 2.

EXAMPLE 4

FIG. 16A is a plan view showing a ferroelectric memory having a ferroelectric capacitor according to Example 4, and FIG. 16B is a sectional view taken along a line B—B of FIG. 16A. Referring to FIGS. 16A and 16B, reference numeral 61 denotes, e.g., a p-type silicon substrate, and a field oxide film 62 for electrically isolating an element region is formed on the surface of the substrate 61. N⁺-type source and drain regions 63 and 64 are formed to be electrically isolated from each other on the surface of the substrate 61 surrounded by the field oxide film 62. A gate oxide film 65 is formed o the substrate 61 including a channel region formed between the source and drain regions 63 and 64, and a gate electrode 66 consisting of, e.g., polycrystalline silicon is formed on the gate oxide film 65. The source and drain regions 63 and 64, the gate oxide film 65, and the gate electrode 66 constitute a MOS transistor. An insulating interlayer 67 consisting of, e.g., SiO₂ is coated on the entire surface of the substrate 61 including the field oxide film 62 and the gate electrode 66. An MgO buffer layer 68 as an insulating film is coated on the insulating interlayer 67. A ferroelectric layer 69 consisting of, e.g., lead zirconate titanate is coated on the buffer layer 68. A rectangular trench 70a is formed from the surface of the ferroelectric layer 69 to the drain region 64 of the substrate 61 through the buffer layer 68 and the insulating interlayer 67, and a first electrode 71a consisting of metal tungsten is buried in the trench 70a. Note that the upper end of the first electrode 71a overlaps the surface of the ferroelectric layer 69 to form an overhang 72 by processing using etching. An insulating layer 73 consisting of a low-melting glass is coated on the ferroelectric layer 69. A rectangular trench 70b is formed from the surface of the insulating layer 73 to the surface of the buffer layer 68 through the ferroelectric layer 69, and a second electrode 71b consisting of metal tungsten is buried in the trench 70b. Note that the upper end of the second electrode 71b projects from the insulating layer 73 and is integrally connected to a wiring layer 74 extending in the same direction as that of the gate electrode 66 by patterning of the metal tungsten as the electrode formation material.

With this arrangement, since a plurality of capacitors in each of which the first and second electrodes 71a and 71b are buried in the trenches 70a and 70b, respectively, formed in the ferroelectric layer 69 to sandwich a portion of the ferroelectric layer 69 located between the trenches 70a and 70b are arranged on the ferroelectric layer 69, a large amount of an electric charge can be stored in a small area. In addition, since the first electrode 71a is directly connected to the drain region 64 of the MOS transistor formed on the silicon substrate 61, formation of a wiring layer on the surface of the ferroelectric layer 69 can be omitted, and the length of the wiring layer can be shortened. By adopting these electrode and transistor structures of a capacitor, therefore, a ferroelectric memory in which memory cells having ferroelectric capacitors are integrated at a high density can be realized.

Furthermore, when a peripheral circuit is formed on the silicon substrate 61 of the above ferroelectric memory, information can be written in and read out from an arbitrary one of a plurality of memory cells arranged in a matrix manner and can be stored.

In addition, since the bottom portion of the second electrode 71b is stopped at the surface of the buffer layer 68, a wiring layer can be arranged in a region (a region of the insulating interlayer 67) below the buffer layer 68. As a result, a ferroelectric memory having a multilayered wiring structure and integrated at a high density can be realized.

EXAMPLE 5

Figure 17:
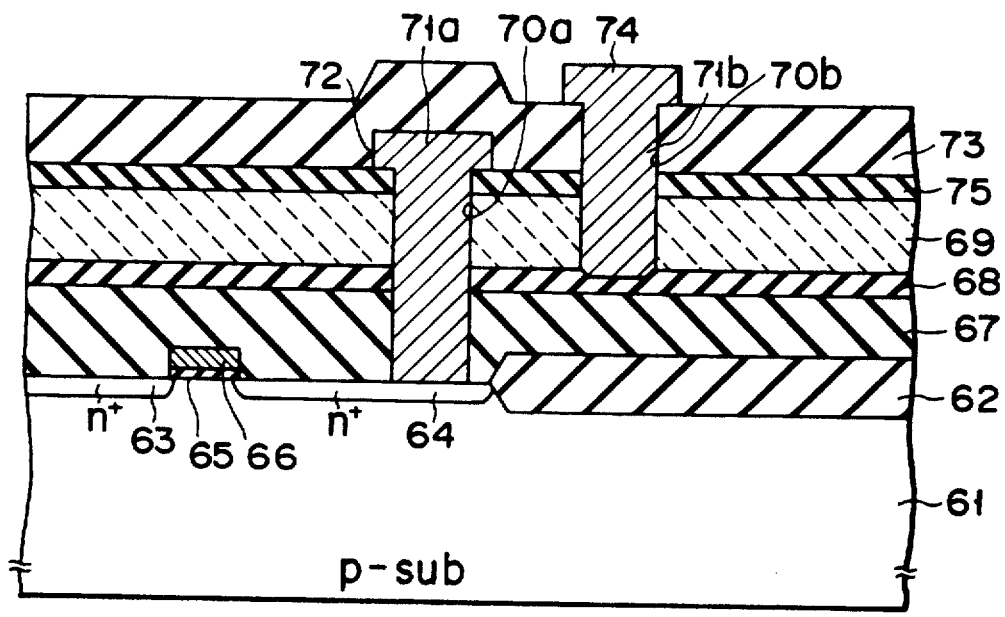
FIG. 17 is a sectional view showing a ferroelectric memory according to Example 5 of the present invention.

FIG. 17 is a sectional view showing a ferroelectric memory having a ferroelectric capacitor according to Example 5. Note that the same reference numerals as in FIGS. 16A and 16B denote the same parts in FIG. 17 and a detailed description thereof will be omitted. In the ferroelectric capacitor according to Example 5, another insulating film 75 consisting of, e.g., MgO is coated on a ferroelectric layer 69, a rectangular trench 70a is formed from the surface of the insulating film 75 to a drain region 64 of silicon substrate 61 through a buffer layer 68 and an insulating interlayer 67, and a first electrode 71a consisting of metal tungsten is buried in the trench 70a. The upper end of the first electrode 71a overlaps the surface of the insulating film 75 to form an overhang 72 by processing using etching.

According to this arrangement, when a voltage is applied across the first electrode 71a and a second electrode 71b by a transistor and a wiring layer 74 formed on the silicon substrate 61, electric field concentration to the ferroelectric layer 69 at the overhang 72 of the first electrode 71a can be suppressed.

That is, if the overhang 72 overlapping the surface of the ferroelectric layer 69 is formed at the upper end of the first electrode 71a by processing using etching as in Example 4 described above, electric field concentration to the ferroelectric layer 69 occurs at the overhang 72 of the first electrode 71a and an electric field to be applied to the ferroelectric layer 69 becomes nonuniform when a voltage is applied across the first and second electrodes 71a and 71b. The electric field concentration to the ferroelectric layer 69 reduces the withstand voltage of the capacitor, and the nonuniform electric field degrades stability of the threshold voltage at which spontaneous polarization of the ferroelectric capacitor is inverted, thereby interfering the use of the ferroelectric capacitor as a memory. In Example 5, however, since the ferroelectric layer 69 is further covered with the insulating film 75 and the overhang 72 of the first electrode 71a is arranged on the insulating film 75, electric field concentration to the ferroelectric layer 69 at the position of the overhang 72 can be suppressed, and a uniform electric field can be applied to the ferroelectric layer 69. Therefore, a ferroelectric memory having a ferroelectric capacitor excellent in a withstand voltage and ferroelectric characteristics can be obtained. According to the experiments conducted by the present inventors, it was confirmed that the withstand voltage of the ferroelectric capacitor of Example 5 was improved to be about 1.3 to 1.6 times that of the capacitor according to Example 4.

EXAMPLE 6

In Example 6, the present invention is applied to a ferroelectric memory having a ferroelectric capacitor. This memory will be described below with reference to manufacturing steps shown in FIGS. 18A to 18I.

First, a p-type silicon substrate 61, for example, was selectively oxidized to form a field oxide film 62 for electrically isolating an element region on the surface of the substrate 61. Subsequently, the surface of the substrate 61 surrounded by the field oxide film 62 was thermally oxidized to form a thin oxide film, and a polycrystalline silicon film containing an impurity such as arsenic was deposited on the entire surface. Thereafter, the polycrystalline silicon film and the oxide film were patterned to form a gate electrode 66 on the substrate 61 via a gate oxide film 65. Subsequently, an n-type impurity such as arsenic was ion-implanted in the substrate 61 by using the field oxide film 62 and the gate electrode 66 as masks, and the implanted arsenic ions were activated to form $n^+$-type source and drain regions 63 and 64 electrically isolated from each other. In this manner, a MOS transistor constituted by the source and drain regions 63 and 64, the gate oxide film 65, and the gate electrode 66 was formed on the substrate 61. Thereafter, an insulating interlayer 67 consisting of, e.g., $SiO_2$ was deposited on the entire surface of the substrate 61 including the field oxide film 62 and the gate electrode 66, and an MgO buffer layer 68 as an insulating film was deposited by an RF magnetron sputtering method (FIG. 18A).

Figure 18C:
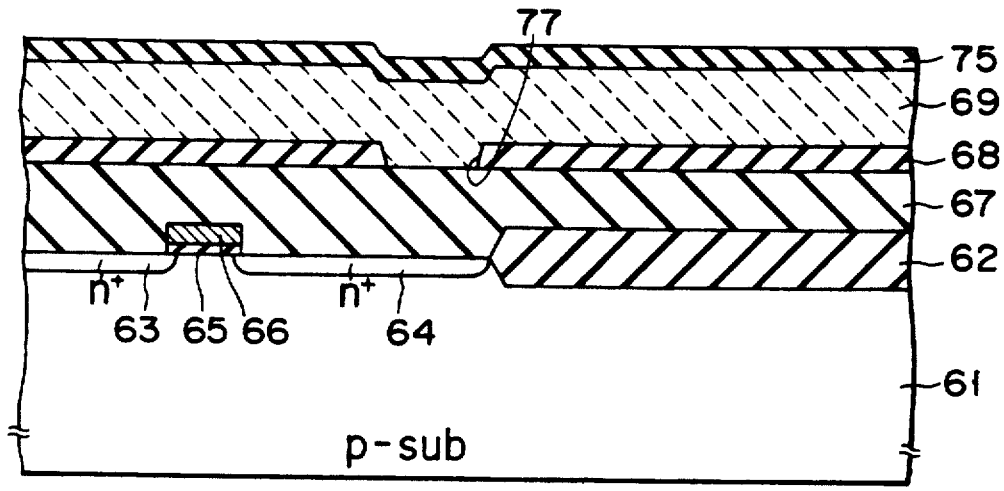

Subsequently, as shown in FIG. 18B, a resist pattern 76 having an opening at a portion (a prospective formation portion of a trench for burying a first electrode) corresponding to a portion of the drain region 64 was formed on the buffer layer 68 by photolithography, and the buffer layer 68 was selectively etched to form an opening 77 by using the resist pattern 76 as a mask. As shown in FIG. 18C, the resist pattern 76 was removed, and a ferroelectric layer 69 consisting of lead zirconate titanate was deposited on the buffer layer 68 by an RF magnetron sputtering method. Thereafter, another insulating film 75 consisting of MgO was deposited by the RF magnetron sputtering method.

Figure 18D:
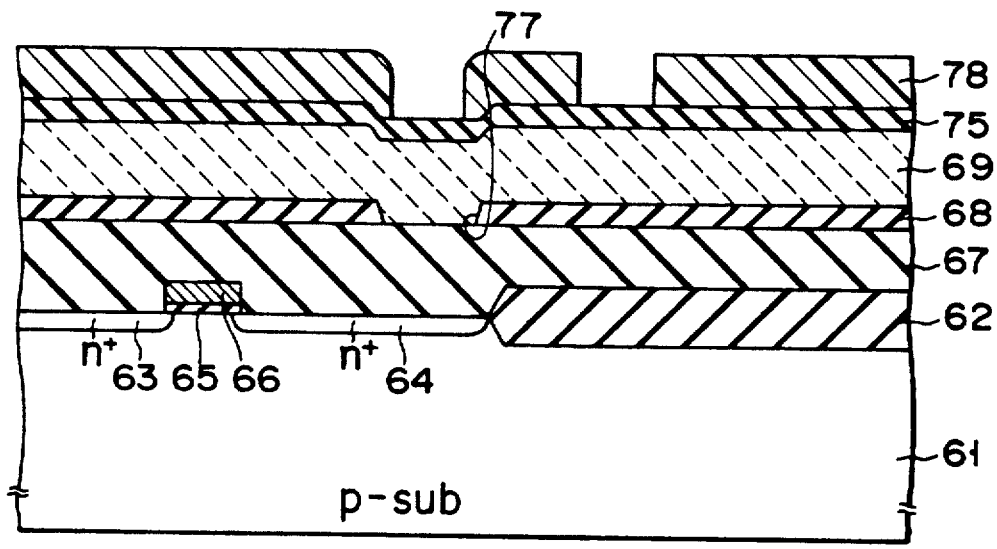
Figure 18E:
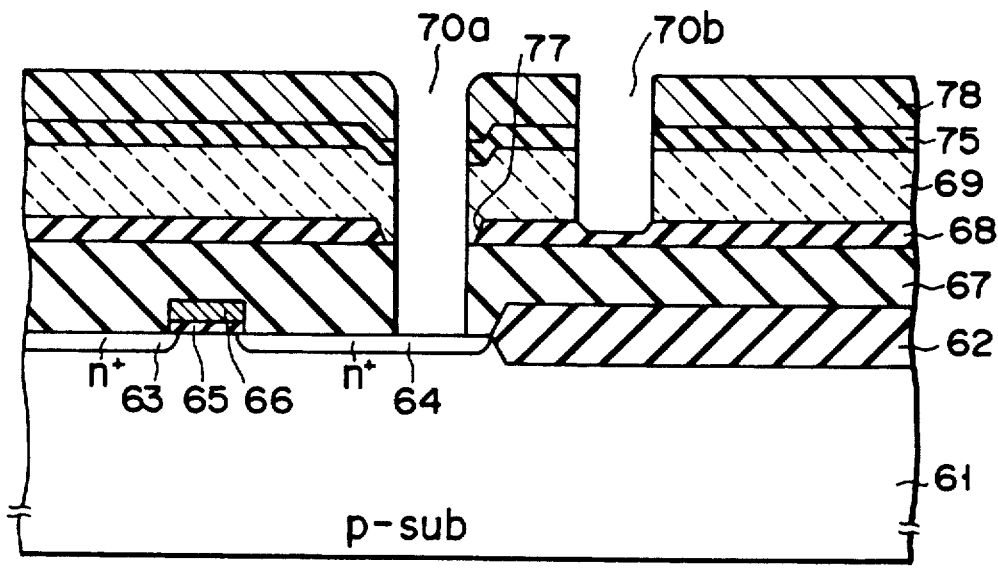

Subsequently, as shown in FIG. 18D, a resist pattern 78 having openings at portions (prospective formation portions of trenches for burying second electrodes) corresponding to the opening 77 and a portion of the field oxide film 62 was formed on the insulating film 75. As shown in FIG. 18E, a chlorine-based reactive gas was used to perform ion beam etching by using the resist pattern 78 as a mask. In this etching, since the opening 77 was formed in the buffer layer 68 at a position below the portion of the insulating film 75 exposed in one opening of the resist pattern 78, etching was performed through the insulating layer 75, the ferroelectric layer 69, the opening of the buffer layer 68, and the insulating interlayer 67, thereby forming a rectangular trench 70a reaching the drain region 64 of the substrate 61. In addition, since the buffer layer 68 serving as an etching stopper was present below the portion of the insulating film 75 exposed in the opening corresponding to a portion of the field oxide film 62, etching was performed to only the insulating layer 75 and the ferroelectric layer 69. Therefore, a rectangular trench 70b having the buffer layer 68 as its bottom was formed.

Figure 18F:
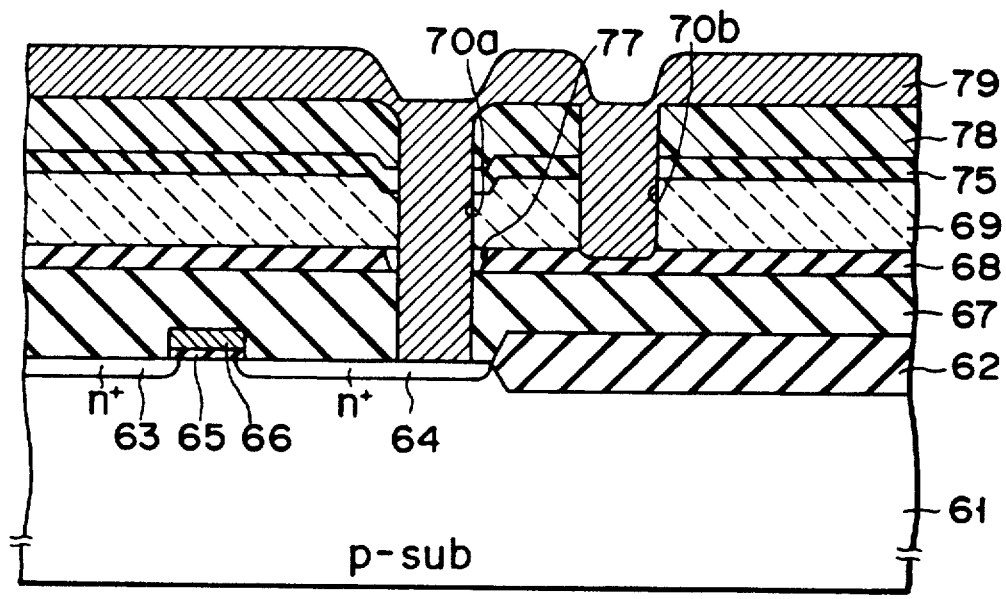
Figure 18I:
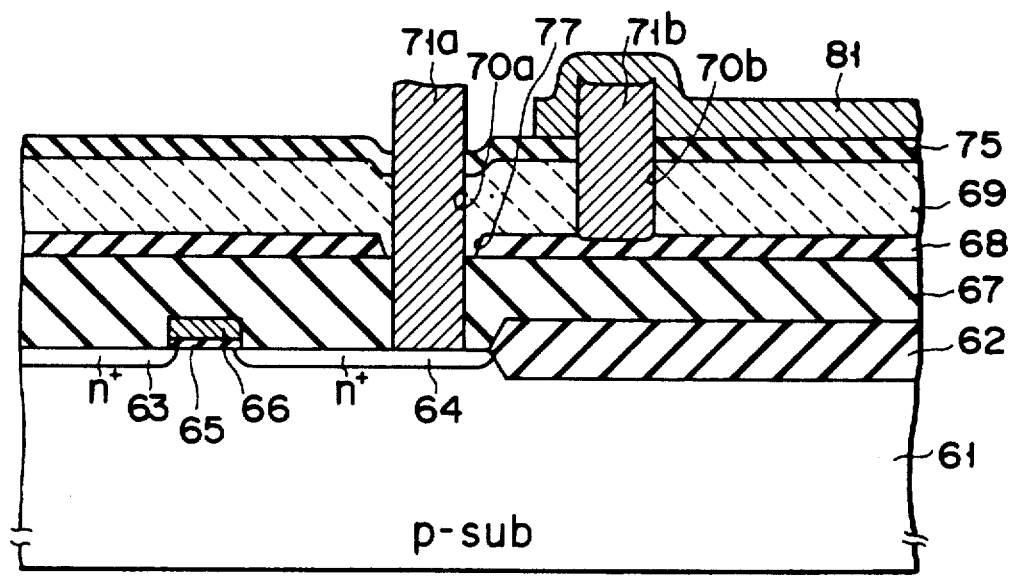
Figure 19:
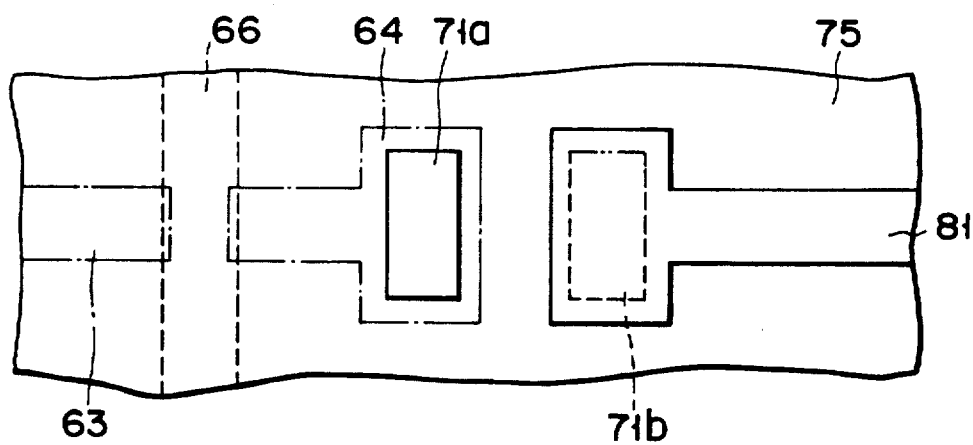
FIG. 19 is a plan view of FIG. 18I.

Subsequently, as shown in FIG. 18F, a metal tungsten film 79 was deposited on the resist pattern 78 including the trenches 70a and 70b by a CVD method of reducing tungsten hexafluoride gas by hydrogen gas while the resist pattern 78 was left unremoved. As shown in FIG. 18G, a lift-off method was performed to remove the resist pattern 78 and selectively remove portions of the metal tungsten film 79 on the resist pattern 78 so that tungsten remained in the trenches 70a and 70b, thereby forming first and second electrodes 71a and 71b, respectively. Subsequently, an Al film 80 was deposited on the entire surface by sputtering as shown in FIG. 18H. Thereafter, as shown in FIGS. 18I and FIG. 19, the Al film 80 was patterned by using a resist pattern (not shown) formed by photolithography as a mask to form an Al wiring layer 81, and to manufacture a ferroelectric memory on which a ferroelectric capacitor was formed on the silicon substrate 61. Note that FIG. 19 is a plan view of FIG. 18I.

According to the method of Example 6, since the opening 77 is formed in the buffer layer 68 in advance and the buffer layer 68 serves as an etching stopper where it is present, the two trenches 70a and 70b having different depths can be formed by ion-beam etching using a single resist pattern as a mask. As a result, since subsequent formation of the first and second electrodes 71a and 71b can be performed by steps of one deposition operation of a metal tungsten film and a lift-off method, the manufacturing steps can be simplified. In addition, since the thickness of the portion of the ferroelectric layer 69 sandwiched between the first and second electrodes 71a and 71b can be set in accordance with a designed size, a thickness variation can be eliminated. Therefore, when a plurality of pairs of first and second electrodes 71a and 71b are formed on the ferroelectric layer 69, a ferroelectric memory having a ferroelectric capacitor excellent in ferroelectric characteristics can be realized.

That is, in the structure as in Example 4 or 5 the trenches 70a and 70b must be formed in different steps, and the first and second electrodes 71a and 71b must be formed independently of each other by deposition of metal tungsten and patterning accordingly, thereby complicating the manufacturing steps. In addition, since the trenches 70a and 70b for burying the first and second electrodes 71a and 71b respectively, are formed independently of each other, the thickness of the portion of the ferroelectric layer 69 located between the trenches 70a and 70b may deviate from a designed size due to a mask misalignment between the trenches. As a result, when a ferroelectric memory is to be realized by forming a plurality of pairs of the first and second electrodes 71a and 71b on the ferroelectric layer 69, variations are produced in ferroelectric characteristics between the ferroelectric capacitors. According to the method of Example 6 of the present invention, however, a ferroelectric memory having a ferroelectric capacitor excellent in ferroelectric characteristics can be manufactured by simple manufacturing steps.

According to the arrangement of Example 6, when the insulating film 75 is coated on the surface on the upper end side of the second electrode 71b and the Al wiring layer 81 connected to the second electrode 71b is formed on the insulating film 75, electric field concentration to the ferroelectric layer at a portion of the Al wiring layer near the projection of the second electrode 71b can be suppressed, and a uniform electric field can be applied to the ferroelectric layer 69. Therefore, a ferroelectric memory having a ferroelectric capacitor excellent in a withstand voltage and ferroelectric characteristics can be realized.

Figure 20A:
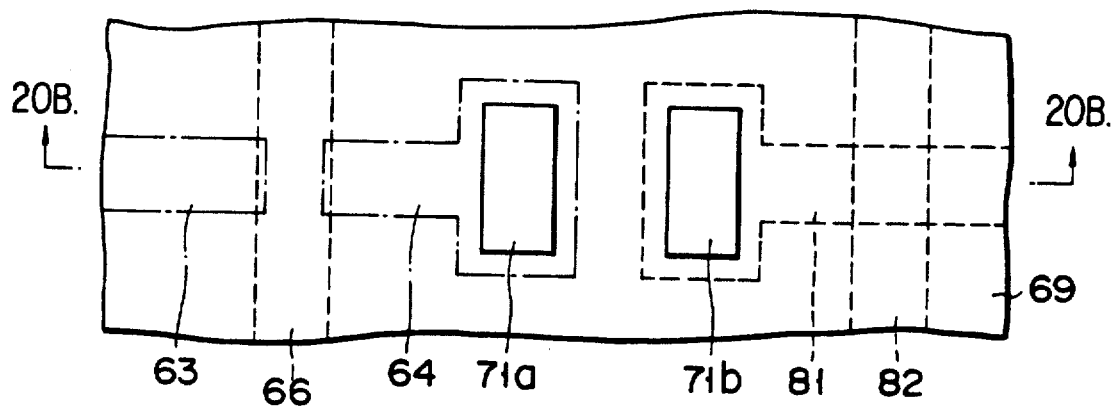
FIG. 20A is a plan view showing a ferroelectric memory according to a modification of Example 6 of the present invention.
Figure 20B:
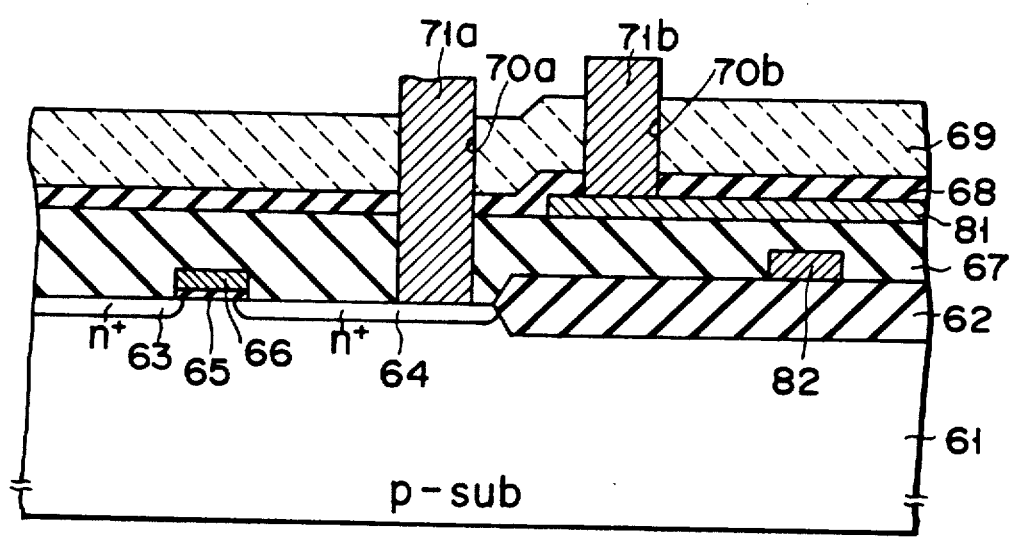
FIG. 20B is a sectional view taken along a line B—B of FIG. 20A.

Note that the buffer layer 68 is used as an etching stopper in Example 6, but the present invention is not limited to the above examples. For example, as shown in FIGS. 20A and 20B, when an Al wiring layer 81 is formed on the upper surface of an insulating interlayer 67, and a buffer layer 68 and a ferroelectric layer 69 are deposited thereon, the Al wiring layer 81 can serve as an etching stopper. As a result, trenches having different depths, i.e., a trench 70a reaching a drain region 64 of a silicon substrate 61 and a trench 70b stopping at the surface of the Al wiring layer 81 can be formed by one ion-beam etching operation using a resist pattern (not shown) as a mask. According to this method, a ferroelectric memory having a ferroelectric capacitor excellent in ferroelectric characteristics similar to that obtained in Example 6 can be manufactured by simple manufacturing steps.

In addition, when the second electrode 71b is connected to the Al wiring layer 81 arranged on the insulating interlayer 67 below the ferroelectric layer 69, another wiring layer can be arranged on the surface of the ferroelectric layer 69. Furthermore, still another wiring 82 can be arranged on the field oxide film 62 as shown in FIGS. 20A and 20B.

EXAMPLE 7

Figures 21A, 21B:
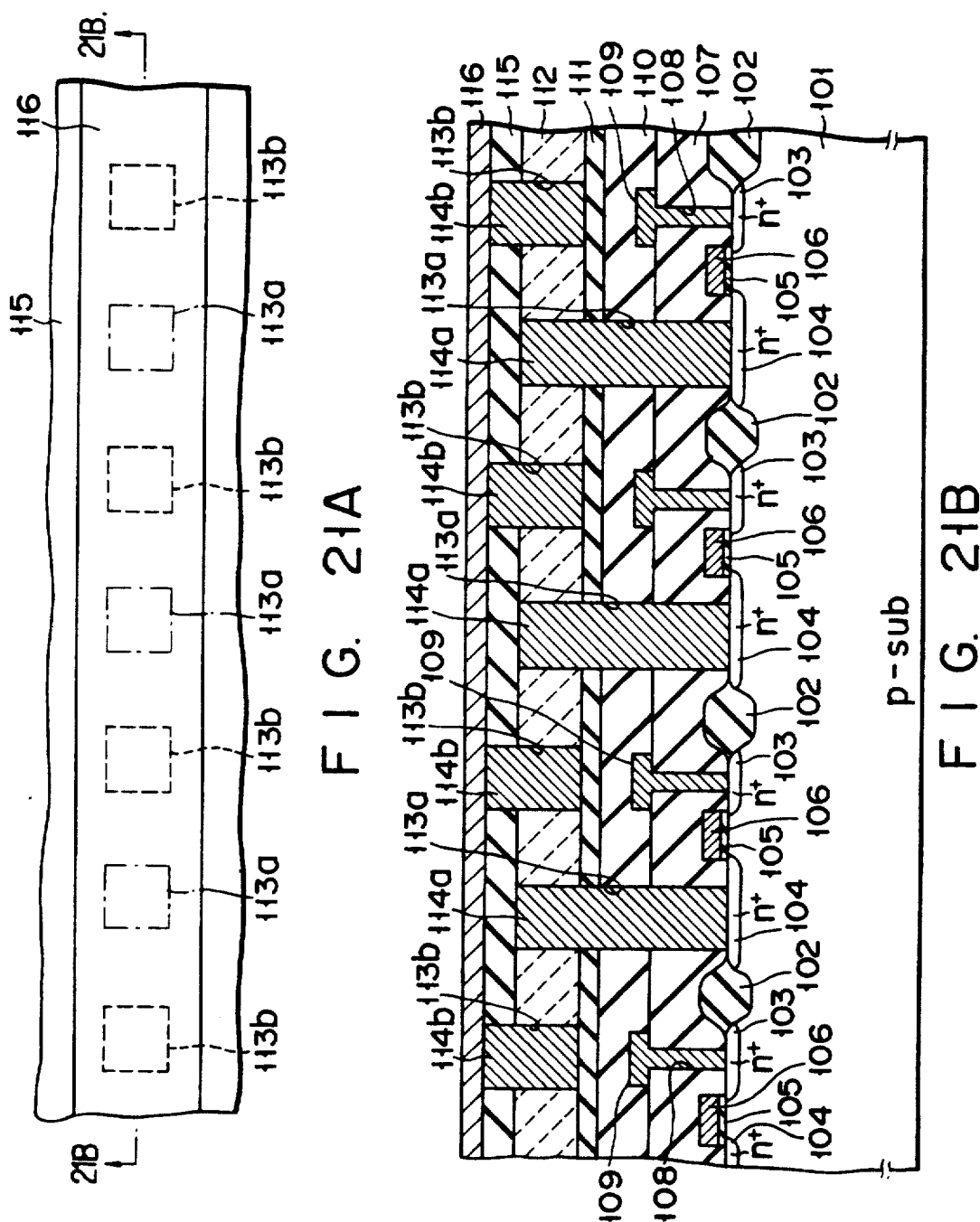
FIG. 21A is a plan view showing a ferroelectric memory according to Example 7 of the present invention.
FIG. 21B is a sectional view taken along a line B—B of FIG. 21A.

FIG. 21A is a plan view showing a ferroelectric memory having a ferroelectric capacitor according to Example 7, and FIG. 21B is a sectional view taken along a line B—B of FIG. 21A. Referring to FIGS. 21A and 21B, reference numeral 101 denotes, e.g., a p-type silicon substrate, and a field oxide film 102 for electrically isolating element regions is formed on the surface of the substrate 101. A plurality of n+-type source and drain regions 103 and 104 are formed to be electrically isolated from each other on the surfaces of a plurality of element regions of the substrate 101 surrounded by the field oxide film 102. Gate oxide films 105 are formed on the substrate 101 including channel regions formed between the source and drain regions 103 and 104, and gate electrodes 106 consisting of, e.g., polycrystalline silicon are formed on the gate oxide films 105, respectively. The source and drain regions 103 and 104, the gate oxide film 105, and the gate electrode 106 constitute a MOS transistor. A first insulating interlayer 107 consisting of, e.g., $SiO_2$ is coated on the entire surface of the substrate 101 including the field oxide film 102 and the gate electrodes 106. A plurality of contact holes 108 are formed in the insulating interlayer 107 at positions corresponding to portions of the source and drain regions 103 and 104. Polycrystalline silicon source electrodes 109 are formed on the insulating interlayer 107 and connected to the source regions 103 through the contact holes 108.

A second insulating interlayer 110 consisting of, e.g., $SiO_2$ is coated on the insulating interlayer 107 including the source electrodes 109. An MgO buffer layer 111 as an insulating film deposited by, e.g., a CVD method is coated on the insulating interlayer 110. A ferroelectric layer 112 consisting of, e.g., lead zirconate titanate is formed on the buffer layer 111. A plurality of rectangular trenches 113a are formed from the surface of the ferroelectric layer 112 to the surfaces of the drain regions 104 of the substrate 101 through the second and first insulating interlayers 110 and 107, and a first electrode 114a consisting of, e.g., metal tungsten is buried in each trench 113a. A third insulating interlayer 115 consisting of SiO₂ is coated on the ferroelectric layer 112. A plurality of trenches 113b are formed between the trenches 113a from the surface of the third insulating interlayer 115 to the surface of the buffer layer 111 through the ferroelectric layer 112, and a second electrode 114b consisting of, e.g., metal tungsten is buried in each trench 113b. That is, the first and second electrodes 114a and 114b are alternately arranged in the ferroelectric layer 112. In addition, an Al wiring layer 116 is formed on the third insulating interlayer 115 and commonly connected to the upper ends of the second electrodes 114b.

According to the ferroelectric memory of Example 7, the first and second electrodes 114a and 114b are alternately arranged in the ferroelectric layer 112 such that the first electrodes 114a are connected to the drain regions 104 of the MOS transistor formed on the substrate 101 and the second electrodes 114b are commonly connected to the Al wiring layer 116. Therefore, as shown in an equivalent circuit diagram of FIG. 22, two ferroelectric capacitors Cs are connected to the drain side of one transistor Tr. Referring to FIG. 22, reference symbol Tr denotes a MOS transistor constituted by the drain regions 103 and 104, the gate oxide film 105, and the gate electrode 106; Cs, a ferroelectric capacitor constituted by a portion of the ferroelectric layer 112 sandwiched between the second electrodes 114b adjacent to each other with the first electrode 114a interposed therebetween; B, a bit line connected to the source electrodes 109; W, a word line connected to the gate electrode 106 of the transistor Tr; and D, a drive line (or a plate line) as the Al wiring layer 116. Therefore, a plurality of ferroelectric capacitors having a large capacity can be formed by a small area to realize a highly integrated ferroelectric memory.

Since the first and second electrodes 114a and 114b are alternately arranged in the ferroelectric layer 112, a crosstalk between the first electrodes 114a can be suppressed by the second electrodes 114b. In this case, if an area of the second electrode is larger than that of the first electrode, the crosstalk can be suppressed more effectively.

In addition, according the above arrangement of Example 7, even if the positions of a plurality of second electrodes 114b adjacent to one another with a plurality of first electrodes 114a interposed therebetween deviated from designed positions, a capacitance variation between two capacitors connected to one transistor Tr can be avoided. This function will be described below with reference to FIGS. 23A, 23B, and 24. Note that FIG. 23A is a plan view showing a ferroelectric memory, FIG. 23B is a sectional view taken along a line B—B of FIG. 23A, and FIG. 24 is an equivalent circuit diagram of the memory shown in FIG. 23A.

The ferroelectric memory shown in FIGS. 23A and 23B is illustrated assuming that the commonly connected second electrodes 114b adjacent to the first electrodes 114a are deviated by ΔL in the arranging direction due to a positional error. Assume that a distance between the electrodes 114a and 114b is L and an electrostatic capacitance between the first electrode 114a and the adjacent second electrode 114b is Cso when there is no positional error. In this case, the electrostatic capacitance Cso can be represented by the following equation:

$$Cso = \epsilon A / L \tag{1}$$

where ε is the permittivity and A is the electrode area. Assuming that L is slightly deviated by ΔL, electrostatic capacity Cs is developed around L as follows:

$$Cs = Cso + (dCso/dL) \cdot \Delta L + \tfrac{1}{2}(d^2Cs/dL^2) \cdot \Delta L \tag{2}$$

The equation (2) is rewritten as follows if high-order terms of quadratic or more are neglected:

$$\begin{aligned} Cs &\approx Cso + (dCso/dL) \cdot \Delta L \\ &= Cso - \epsilon A L / L^2 \\ &= Cso - \Delta Cs \end{aligned} \tag{3}$$

An electrostatic capacitance obtained when the inter-electrode distance is deviated by −ΔL due to a positional error is represented by the following equation:

$$\begin{aligned} Cs &\approx Cso + (dCso/dL) \cdot (-\Delta L) \\ &= Cso + \epsilon A \Delta L / L^2 \\ &= Cso + \Delta Cs \end{aligned} \tag{4}$$

As shown in FIGS. 23A and 23B, a distance between the first electrode 114a and the second electrode 114b adjacent at one side (left side) thereof is L+ΔL, and a capacitance is obtained as Cso−ΔCs accordingly. A distance between this first electrode 114a and the second electrode 114b adjacent at the other side (right side) thereof is L−ΔL, and a capacitance is obtained as Cso+ΔC2 accordingly. Therefore, the capacitance between the two second electrodes 114b adjacent to the first electrode 114a sideway is obtained as the sum of Cso−ΔCs and Cso+ΔCs unless ΔL is extremely large. As a result, even if a positional error is caused, this capacitance remains unchanged to be 2Cso so as to effectively prevent a capacitance variation.

EXAMPLE 8

Figure 25A:
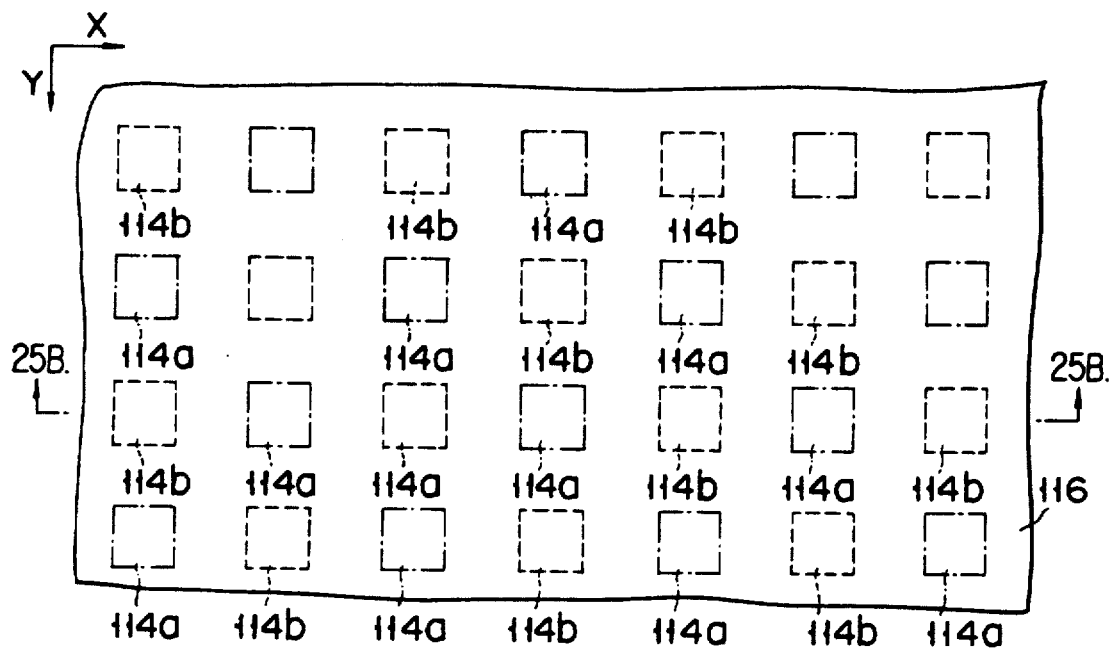
FIG. 25A is a plan view showing a ferroelectric memory according to Example 8 of the present invention.

FIG. 25A is a plan view showing a ferroelectric memory having a ferroelectric capacitor according to Example 8, and FIG. 25B is a sectional view taken along a line B—B of FIG. 25A. Note that the same reference numerals as in FIGS. 21A and 21B denote the same parts in FIGS. 25A and 25B and a detailed description thereof will be omitted. This ferroelectric memory of Example 8 has a plurality of ferroelectric capacitors in which a plurality of trenches 113a and 113b having different depths are two-dimensionally formed in a ferroelectric layer 112, first and second electrodes 114a and 114b are buried in the trenches 113a and 113b, respectively, so as to be alternately arranged in the X and Y directions, the first electrodes 114a are connected to drain regions 104 of MOS transistors formed on a substrate 101, and the second electrodes 114b are commonly connected to an Al wiring layer 116 arranged on a third insulating interlayer 115.

Figure 26:
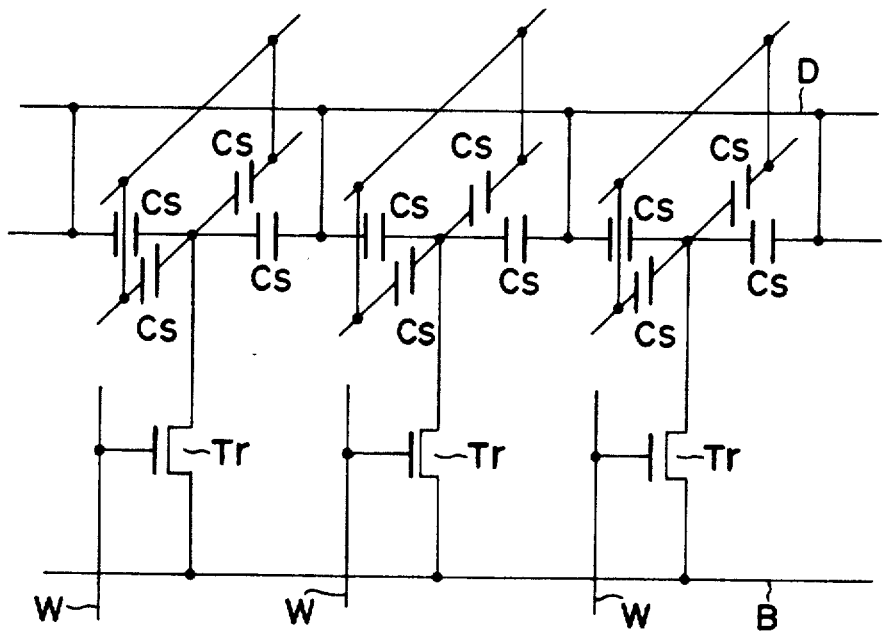
FIG. 26 is an equivalent circuit diagram of the ferroelectric memory shown in FIG. 25A.

In the ferroelectric memory of Example 8, as shown in an equivalent circuit diagram of FIG. 26, four ferroelectric capacitors Cs are connected to the drain side of one transistor Tr. Referring to FIG. 26, reference symbol Tr denotes a MOS transistor constituted by source and drain regions 103 and 104, a gate oxide film 105, and a gate electrode 106; Cs, a ferroelectric capacitor constituted by a portion of the ferroelectric layer 112 surrounded by four second electrodes 114b adjacent to the first electrode 114a in the X and Y directions; B, a bit line connected to source electrodes 109; W, a word line connected to the gate electrode 106 of the MOS transistor Tr; and D, a drive line (or a plate line) as the Al wiring layer 116. According to Example 8, therefore, a plurality of ferroelectric capacitors having a large capacity can be formed by a smaller area than that of Example 7 to realize a highly integrated ferroelectric memory.

EXAMPLE 9

Figure 27A:
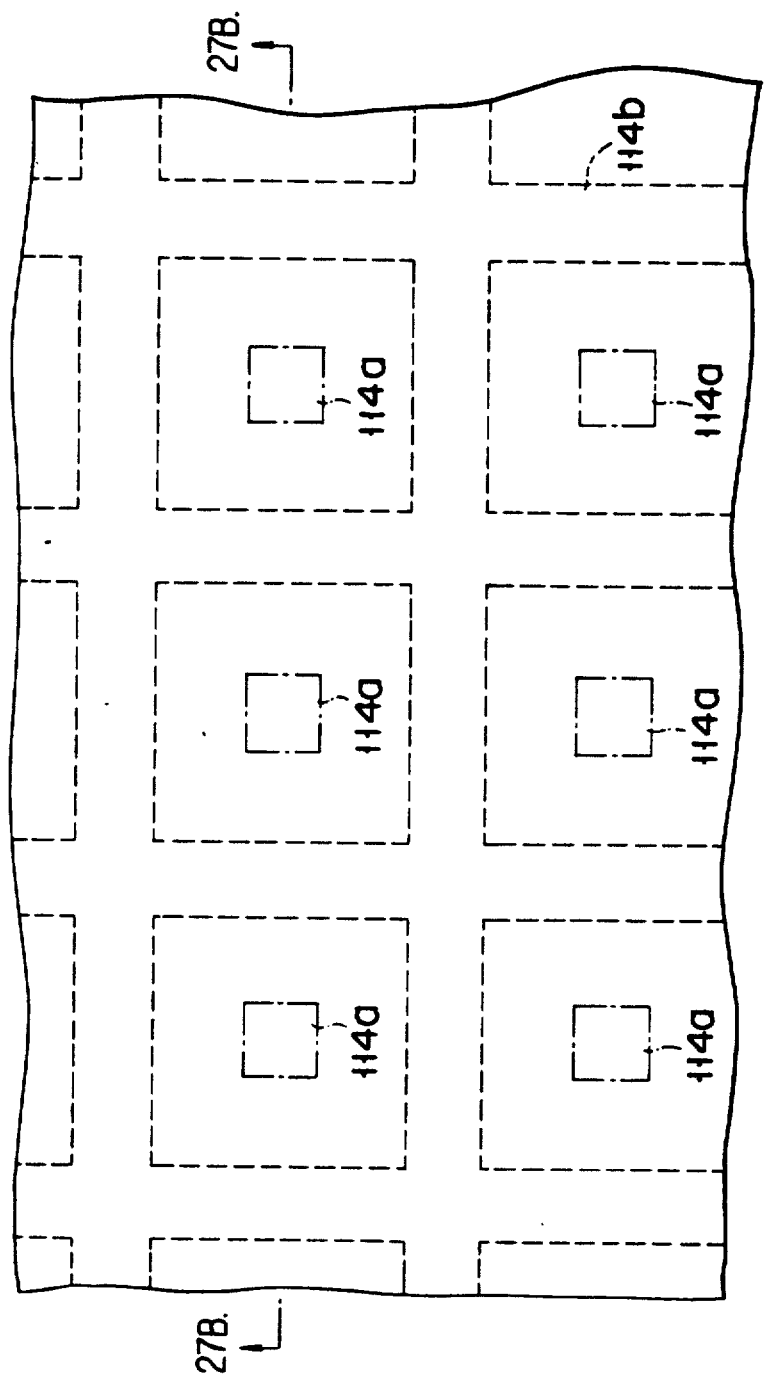
FIG. 27A is a plan view showing a ferroelectric memory according to Example 9 of the present invention.

FIG. 27A is a plan view showing a ferroelectric memory having a ferroelectric capacitor according to Example 9, and FIG. 27B is a sectional view taken along a line B—B of FIG. 27A. Note that the same reference numerals as in FIGS. 21A and 21B denote the same parts in FIGS. 27A and 27B and a detailed description thereof will be omitted. This ferroelectric memory of Example 9 has a plurality of ferroelectric capacitors in which a plurality of rectangular trenches 113a are formed from the surface of a ferroelectric layer 112 to the surfaces of drain regions 104 of a substrate 101 through a buffer layer 111 and second and first insulating interlayers 110 and 107, a first electrode 114a consisting of, e.g., metal tungsten is buried in each trench 113a and connected to the drain region 104 of a MOS transistor formed on the silicon substrate 101, a lattice-like trench 113 is formed from the surface of a third insulating interlayer 115 to the surface of the buffer layer 111 through the ferroelectric layer 112 so as to surround the trenches 113a, and a second electrode 114b consisting of, e.g., metal tungsten, is buried in the lattice-like trench 113 and commonly connected to an Al wiring layer 116 arranged on the third insulating interlayer 115.

Similar to the ferroelectric memory of Example 8, in the ferroelectric memory of Example 9, as shown in an equivalent circuit diagram of FIG. 26, four ferroelectric capacitors Cs are connected to the drain side of one transistor Tr. According to Example 9, therefore, a plurality of ferroelectric capacitors having a large area can be formed by a smaller area than that of Example 7 to realize a highly integrated ferroelectric memory.

In addition, since the second electrode 114b is interposed between the adjacent first electrodes 114a, cross talk between the adjacent first electrodes 114a can be reliably suppressed.

EXAMPLE 10

In Example 10, the present invention is applied to the manufacture of a ferroelectric memory having a ferroelectric capacitor. The manufacturing steps will be described in detail below with reference to FIGS. 28A to 28F and 29 to 36.

Figure 28D:
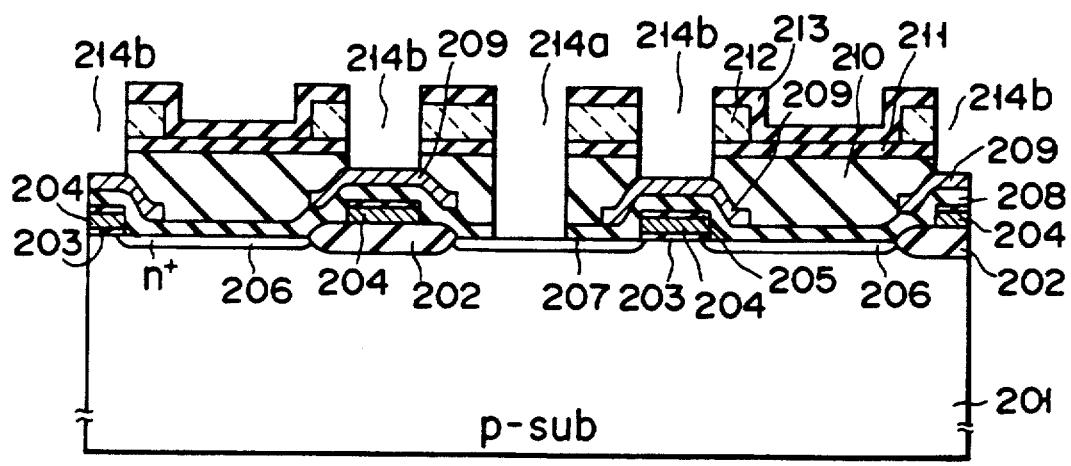
Figure 29:
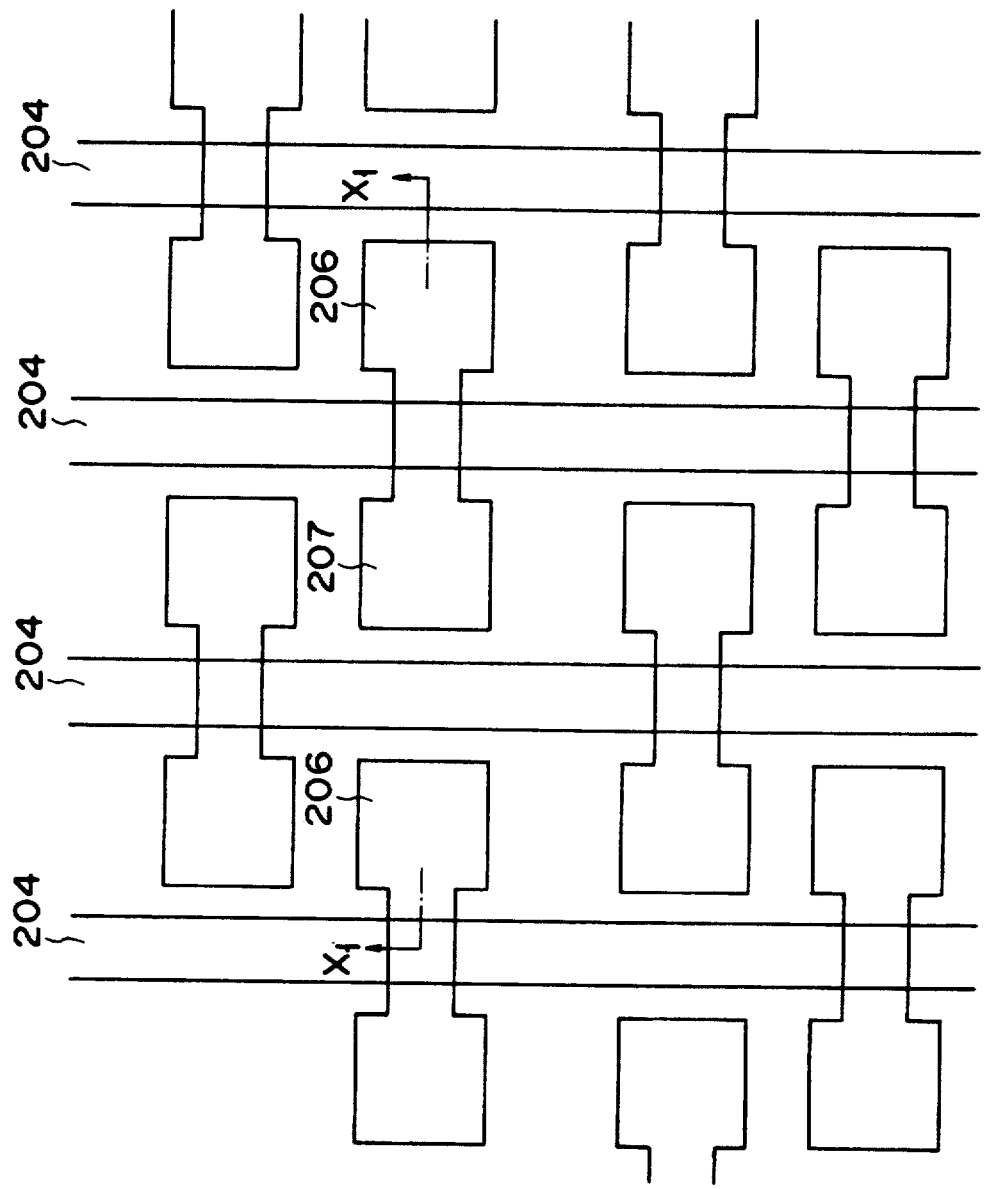
FIG. 29 is a plan view of FIG. 28A.

First, a p-type silicon substrate 201, for example, was selectively oxidized to form a field oxide film 202 for electrically isolating an element region on the surface of the substrate 201. Subsequently, the surface of the substrate 201 surrounded by the field oxide film 202 was thermally oxidized to form a thin oxide film, and a polycrystalline silicon film containing an impurity such as arsenic was deposited on the entire surface. After the polycrystalline silicon film was thermally oxidized to form a silicon oxide film on its surface, these silicon oxide film, polycrystalline silicon film, and oxide film were patterned to form gate electrodes 204 and silicon oxide film patterns 205 on the substrate 201 via a gate oxide film 203. Subsequently, an n-type impurity, e.g., arsenic was ion-implanted in the substrate 201 by using the field oxide film 202 and the gate electrode 204 as masks and the implanted arsenic ions were activated to form n+-type source and drain regions 206 and 207 electrically isolated from each other as shown in FIGS. 28A and 29. In this manner, a MOS transistor constituted by the source and drain regions 206 and 207, the gate oxide film 203, and the gate electrode 204 was manufactured. Note that FIG. 29 is a plan view of FIG. 28A, and FIG. 28A is a sectional view taken along a line $X_1$-$X_2$ of FIG. 29.

Figure 30:
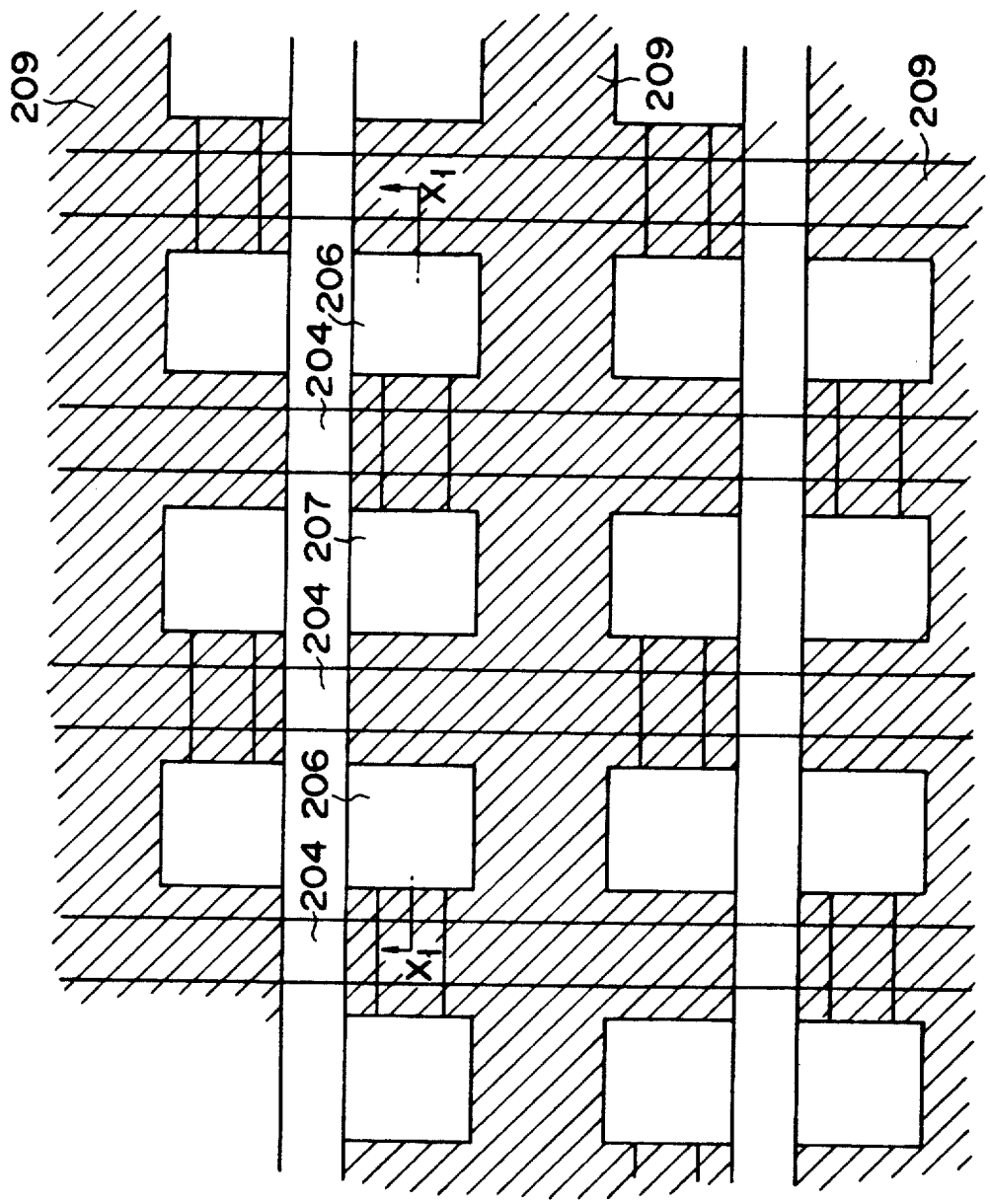
FIG. 30 is a plan view of FIG. 28B.

Subsequently, a first insulating interlayer 208 consisting of $SiO_2$ was deposited on the entire surface of the substrate 201 including the field oxide film 202 and the gate electrode 204 by, e.g., a CVD method. Thereafter, a polycrystalline silicon film containing an n-type impurity such as arsenic was deposited by a CVD method and patterned to form a plate line 209 as shown in FIGS. 28B and FIG. 30. This plate line 209 were omitted at portions of the source and drain regions 206 and 207 and isolated to be commonly connected to two ferroelectric capacitors aligned in the column direction. Note that FIG. 30 is a plan view of FIG. 28B, and FIG. 28B is a sectional view take along a line $X_1$-$X_1$ of FIG. 30.

Subsequently, a second insulating interlayer 210 consisting of, e.g., boron phosphosilicate glass (BPSG) was deposited on the first insulating interlayer 208 including the plate line 209 by a CVD method, and an MgO buffer layer 211 as an insulating film was deposited by an RF magnetron sputtering method. Thereafter, lead zirconate titanate, for example, was deposited by an RF magnetron sputtering method and patterned on the buffer layer 211. In this step, a ferroelectric layer 212 was formed to be omitted at portions of the source regions 206 and commonly connected to two ferroelectric capacitors aligned in the column direction as shown in FIGS. 28C and 31. Note that FIG. 31 is a plan view of FIG. 28C, and FIG. 28C is a sectional view taken along a line $X_1$-$X_1$ of FIG. 31.

Figure 32:
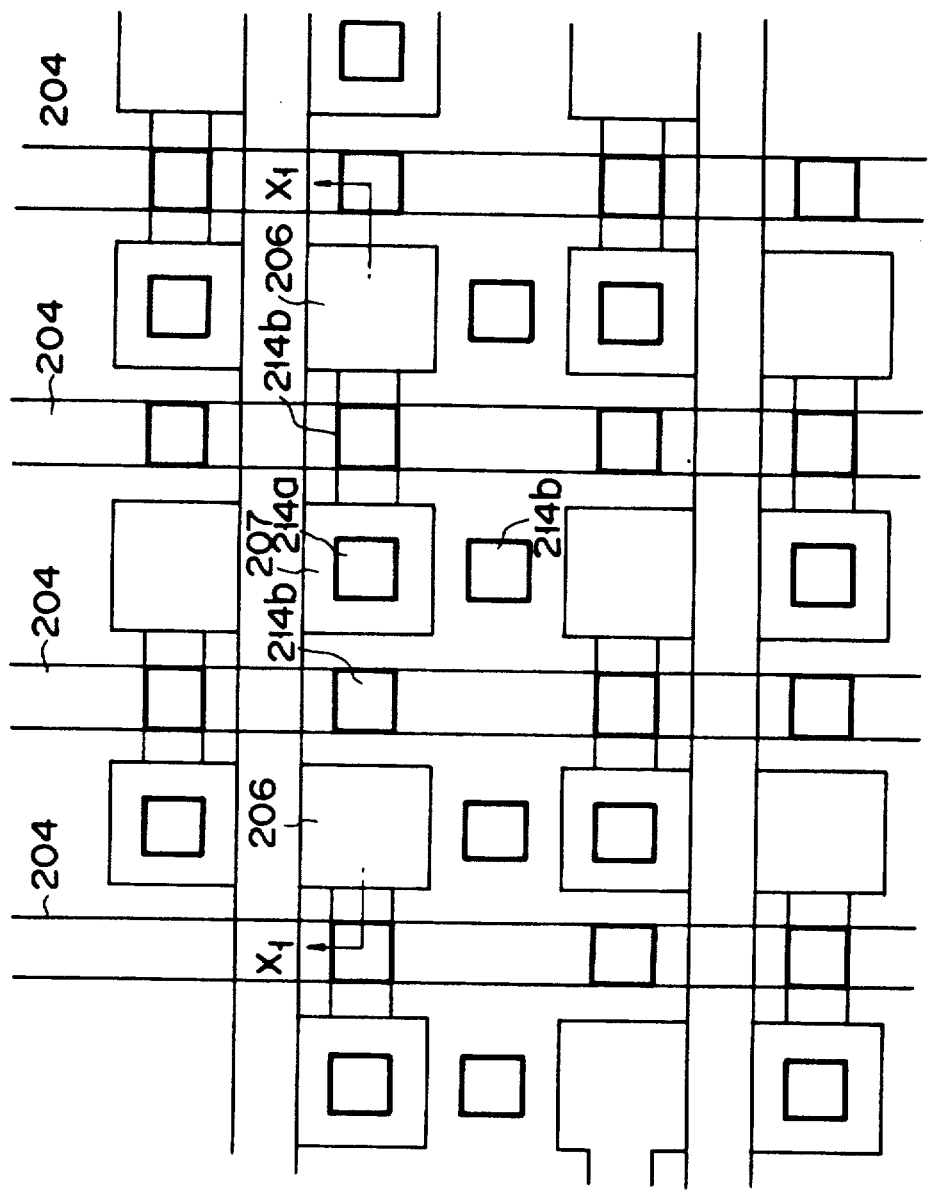
FIG. 32 is a plan view of FIG. 28D.

Subsequently, a third insulating interlayer 213 consisting of, e.g., $SiO_2$ was deposited on the entire surface by a CVD method. After the third insulating interlayer 213 was deposited, annealing was performed at a temperature of 700° C. to getter the impurity contained in the ferroelectric layer 212 to the second or third insulating interlayer 210 or 213. Upon this gettering, even if non-ferroelectric layers (low-permittivity layers) are formed in interfaces between the ferroelectric layer 21 and the second and third insulating interlayers 210 and 213, no problem is posed in characteristics. Thereafter, a resist pattern (not shown) in which first and second electrode trench prospective formation portions were formed, was formed on the third insulating interlayer 213 by photolithography and used as a mask to perform ion-beam etching by using a chlorine-based reactive gas. In this step, rectangular trenches 214a and 214b having different depths were formed as shown in FIGS. 28D and 32. The trench 214a was formed to reach the drain region 207, and the trenches 214b were arranged at three sides of the trench 214a. Each trench 214b had the surface of the plate line 209 as its bottom due to an etching stopper effect of the plate line 209. Note that FIG. 32 is a plan view of FIG. 28D, and FIG. 28D is a sectional view taken along a line $X_1$-$X_1$ of FIG. 32.

Figure 28E:
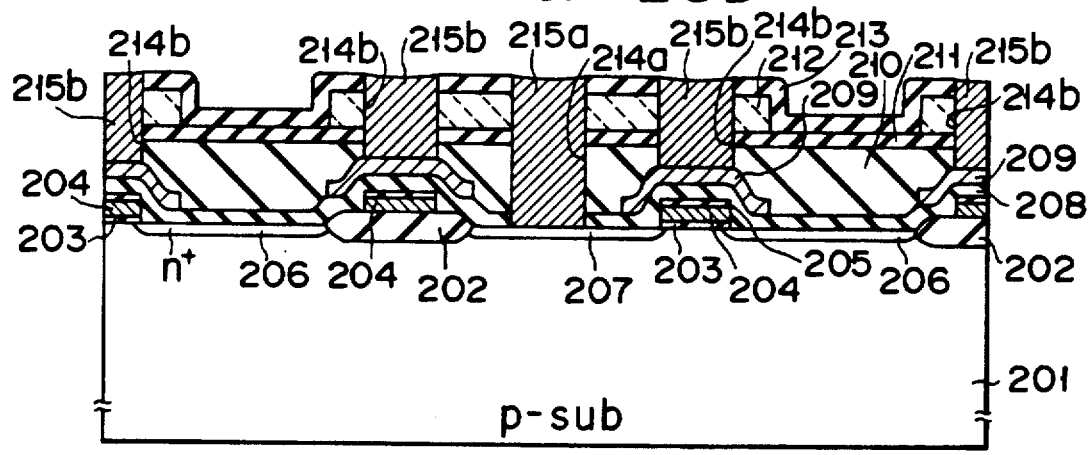

Subsequently, a metal tungsten film was deposited on the resist pattern including the trenches 214a and 214b by a CVD method of reducing tungsten hexafluoride gas by hydrogen gas while the resist pattern (not shown) was left unremoved. Thereafter, the resist pattern was removed, and a lift-off method was performed to selectively remove portions of the metal tungsten film on the resist pattern such that tungsten remained in the trenches 214a and 214b as shown in FIG. 28E, thereby forming first and second electrodes 215a and 215b.

Figure 28F:
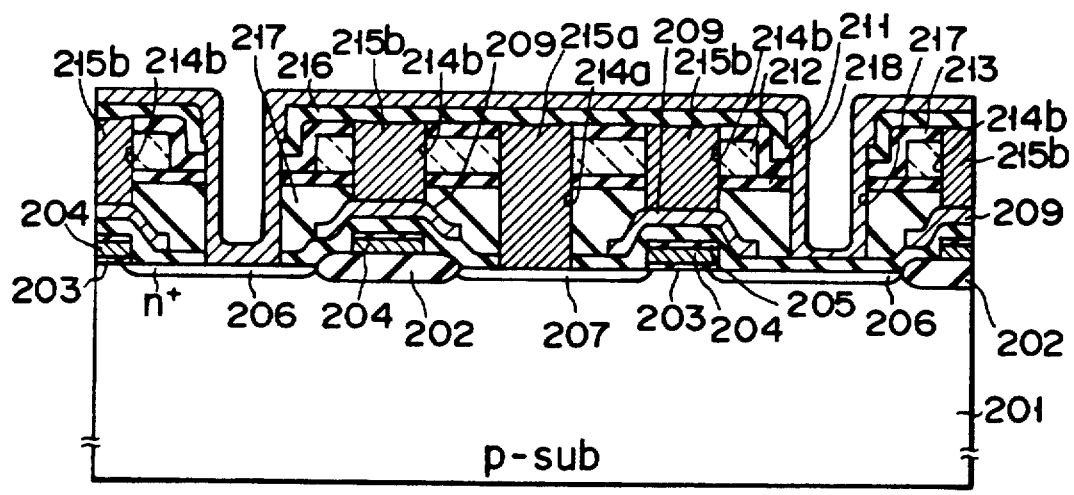
Figure 33:
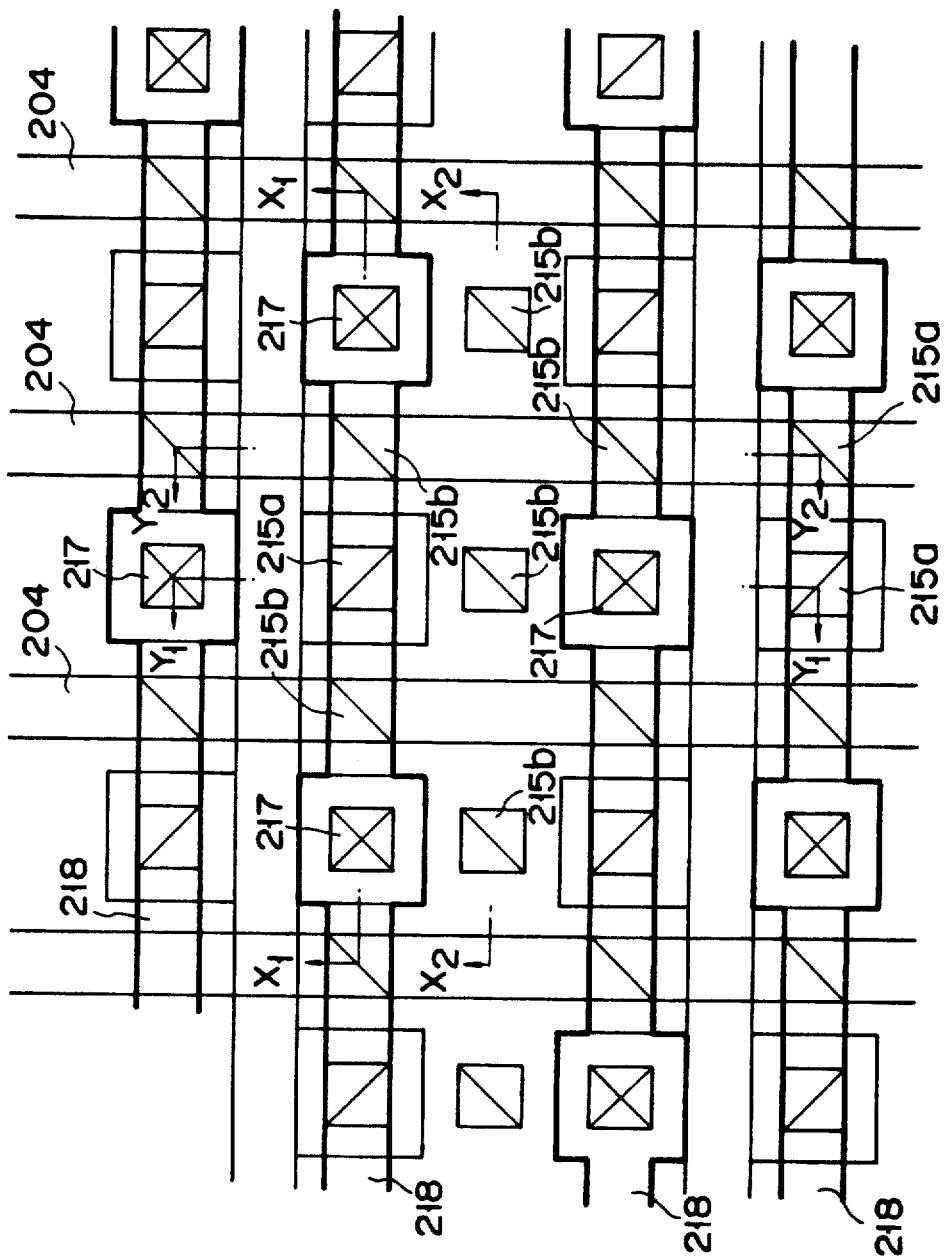
FIG. 33 is a plan view of FIG. 28F.
Figure 34:
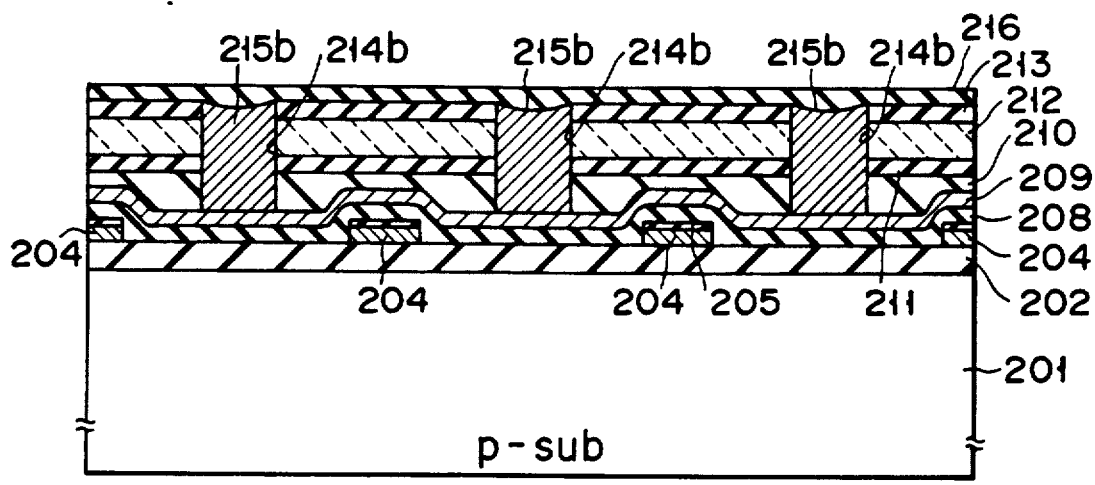
FIG. 34 is a sectional view taken along a line $X_2$—$X_2$ of FIG. 33.
Figure 35:
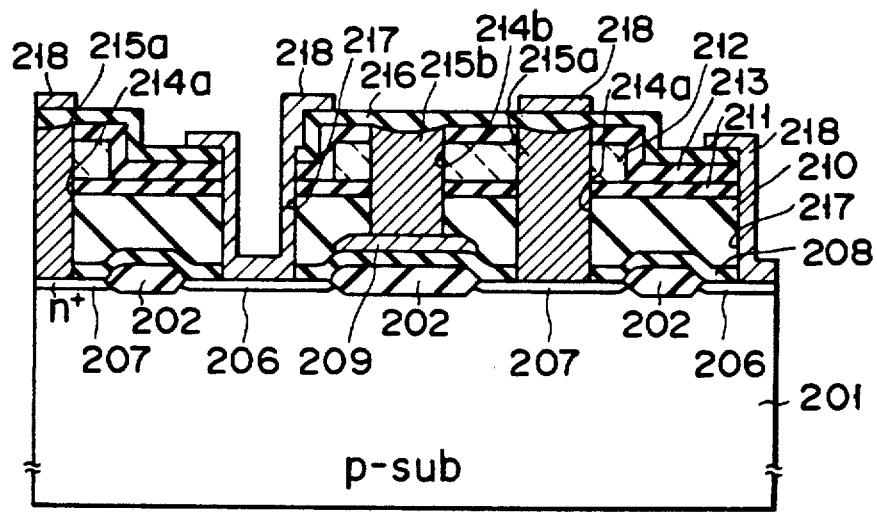
FIG. 35 is a sectional view taken along a line $Y_1$—$Y_1$ of FIG. 33.
Figure 36:
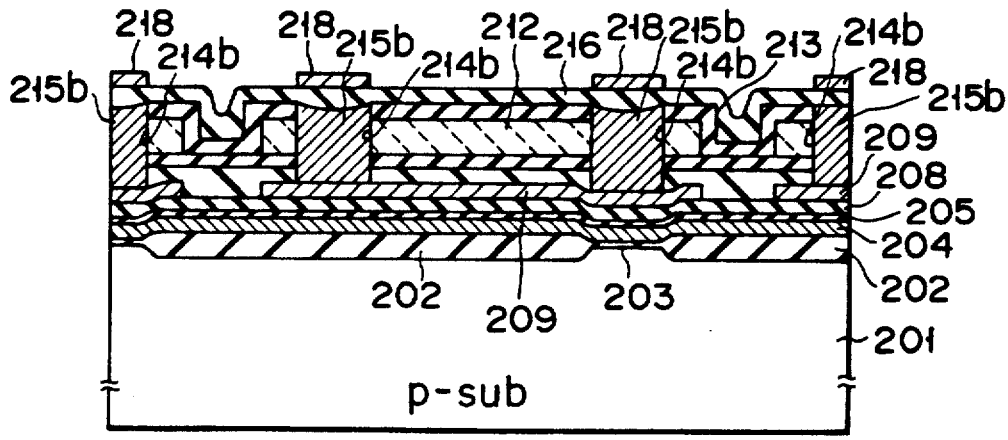
FIG. 36 is a sectional view taken along a line $Y_2$—$Y_2$ of FIG. 33.

Subsequently, a fourth insulating interlayer 216 consisting of, e.g., $Si_2$ was deposited by a CVD method on the third insulating interlayer 213 on which the upper surfaces of the first and second electrodes 215a and 215b were exposed, and selective etching was performed throughout the fourth and third insulating interlayers 216 and 213, the buffer layer 211, and the second and first insulating interlayers 210 and 208 corresponding to the source regions 206, thereby forming contact holes 217. Subsequently, an Al film was deposited on the entire surface and was patterned to form Al wiring layers 218 connected to the source regions 206 through the contact holes 217. Thereafter, a protective film (not shown) was deposited on the entire surface to manufacture a ferroelectric memory having a plurality of ferroelectric capacitors as shown in FIGS. 28F and 33 to 36. Note that FIG. 33 is a plan view of FIG. 28F, and FIG. 28F is a sectional view taken along a line $X_1$-$X_1$ of FIG. 33. FIGS. 34 to 36 are sectional views taken along lines $X_2$—$X_2$, $Y_1$—$Y_1$, and $Y_2$—$Y_2$ of FIG. 33, respectively.

According to the method of Example 10, the plate line 209 omitted at portions corresponding to the source and drain regions 206 and 207 and consisting of, e.g., polycrystalline silicon is formed on the first insulating interlayer 208 and used as an etching stopper to form the trenches 214a and 214b having different depths, i.e., the trench 214a reaching the drain region 207 and the trench 214b having the plate line 209 as its bottom by one ion-beam etching operation. As a result, since subsequent formation of the first and second electrodes 215a and 215b can be performed by a single step of deposition of the metal tungsten film and a lift-off method or the like, the manufacturing steps can be simplified. In addition, since the thickness of a portion of the ferroelectric layer 212 sandwiched between the first and second electrodes 215a and 215b can be set in accordance with a designed size, a ferroelectric memory having a plurality of ferroelectric capacitors having a stable capacity and excellent in ferroelectric characteristics can be realized.

According to the arrangement of Example 10, as shown in FIGS. 28F and 33 to 36, the second electrodes 215b commonly connected to the plate line 209 can be arranged via the ferroelectric layer 212 at three sides of the first electrode 215a connected to the drain region 207 of one transistor. Therefore, since three ferroelectric capacitors can be connected to the drain region of the transistor, a highly integrated ferroelectric memory can be realized.

Furthermore, since the second electrodes 215b are commonly connected to the plate line 209 arranged below the ferroelectric layer 212, the Al wiring layer 218 used as a bit line can be arranged on the fourth insulating interlayer 216 formed on the upper surface of the ferroelectric layer 212. Therefore, a degree of freedom of design can be increased, and a highly integrated ferroelectric memory can be realized.

Note that a ferroelectric layer (e.g., a barium strontium niobate layer having a tetragonal tungsten.bronze type crystal structure) having a spontaneous polarization axis in the surface direction was formed on a buffer layer following the same procedures as in Examples 1 to 10, trenches were formed, and first and second electrodes were buried in the trenches, thereby forming a ferroelectric capacitor. It was confirmed that this ferroelectric capacitor had a specific hysteresis curve in ferroelectric characteristics.

As has been described above, according to the present invention, a ferroelectric capacitor having a large electrode area as compared with its small area and capable of storing a large amount of an electric charge can be provided. It should be also noted that the ferroelectric characteristic is hardly affected by the low-permittivity layer arranged between the ferroelectric layer and underlying layer, so that the ferroelectric capacitor provided by the present invention has satisfactory electric characteristics. In addition, according to the present invention, a ferroelectric capacitor having good ferroelectric characteristics can be provided even if a ferroelectric layer in which the direction of a spontaneous polarization axis corresponds to the surface direction is used. Furthermore, according to the present invention, since capacitors and a capacitor and a wiring layer are electrically isolated by an insulating material, a frequency of erroneous operations can be decreased, and a delay time caused by a stray capacitance can be reduced. As a result, a highly integrated capacitor array can be realized.

Furthermore, according to the present invention, since one of first and second electrodes of a ferroelectric capacitor is connected to a transistor formed on a substrate while the other electrode is connected to an external wiring layer or the first and se electrodes are alternately arranged such that one electrode is connected to a transistor while the other one is commonly connected to a wiring layer, a semiconductor device such as a ferroelectric memory in which a plurality of ferroelectric capacitors are highly integrated can be realized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A ferroelectric capacitor comprising:
   a ferroelectric layer formed on a substrate;
   a plurality of trenches formed in the direction of thickness of said ferroelectric layer to oppose each other with a ferroelectric material therebetween; and
   first and second electrodes buried in said trenches with said ferroelectric material therebetween.

2. A capacitor according to claim 1, wherein said first and second electrodes are buried in said trenches with an insulating material therebetween at a portion except for a contact portion with respect to said ferroelectric material.

3. A capacitor according to claim 1, wherein said ferroelectric layer consists of lead zirconate titanate.

4. A capacitor according to claim 1, wherein an insulating film is interposed between said substrate and said ferroelectric layer.

5. A capacitor according to claim 4, wherein said insulating film consists of magnesia.

6. A semiconductor device comprising:
a substrate;
an insulating film formed on said substrate;
a ferroelectric capacitor constituted by a ferroelectric layer formed on said insulating film, a plurality of trenches formed in the direction of thickness of said ferroelectric layer with a ferroelectric material therebetween, and first and second electrodes buried in said trenches to oppose each other with said ferroelectric material therebetween; and
a transistor formed on said substrate and connected to one of said first and second electrodes of said ferroelectric capacitor.

7. A device according to claim 6, wherein said insulating film consists of magnesia.

8. A device according to claim 6, wherein said substrate consists of silicon, and said transistor is constituted by source and drain regions formed on said substrate, a gate insulating film formed on said substrate including a channel region formed between said source and drain regions, and a gate electrode formed on said gate insulating film.

9. A device according to claim 6 or 8, wherein one of said first and second electrodes of said ferroelectric capacitor is directly connected to a source region or drain region of said transistor.

10. A device according to claim 6, wherein the other one of said first and second electrodes is connected to a wiring layer formed on said ferroelectric layer.

11. A device according to claim 10, wherein an insulating film is interposed between said ferroelectric layer and said wiring layer.

12. A semiconductor device comprising:
a substrate;
an insulating film formed on said substrate;
a ferroelectric capacitor constituted by a ferroelectric layer formed on said insulating film, a plurality of trenches formed in the direction of thickness of said ferroelectric layer with a ferroelectric material therebetween, and first and second electrodes alternately buried in said trenches to oppose each other with said ferroelectric material therebetween;
a transistor formed on said substrate and connected to said first electrode of said ferroelectric capacitor; and
a wiring layer, formed on said ferroelectric layer of said ferroelectric capacitor, for commonly connecting said second electrode of said capacitor.

13. A device according to claim 12, wherein said insulating film consists of magnesia.

14. A device according to claim 12, wherein said substrate consists of silicon, and said transistor is constituted by source and drain regions formed on said substrate, a gate insulating film formed on said substrate including a channel region formed between said source and drain regions, and a gate electrode formed on said gate insulating film.

15. A device according to claim 14, wherein said first electrode of said ferroelectric capacitor is directly connected to one of said source and drain regions of said transistor.

16. A device according to claim 12, wherein an insulating film is interposed between said ferroelectric layer and said wiring layer.

17. A device according to claim 12, wherein said transistor has source and drain regions and said first electrode of said ferroelectric capacitor is directly connected to one of said source and drain regions of said transistor.

* * * * *